United States Patent
Kwon et al.

(10) Patent No.: US 8,604,614 B2
(45) Date of Patent: Dec. 10, 2013

(54) SEMICONDUCTOR PACKAGES HAVING WARPAGE COMPENSATION

(75) Inventors: Heung-kyu Kwon, Seongnam-si (KR);
Seok-won Lee, Seongnam-si (KR);
Hyon-chol Kim, Hwaseong-si (KR);
Su-chang Lee, Seoul (KR); Chi-young Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 169 days.

(21) Appl. No.: 13/073,250

(22) Filed: Mar. 28, 2011

(65) Prior Publication Data

US 2011/0233771 A1    Sep. 29, 2011

(30) Foreign Application Priority Data

Mar. 26, 2010  (KR) .................. 10-2010-0027540
Jul. 15, 2010   (KR) .................. 10-2010-0068584

(51) Int. Cl.
*H01L 23/48*   (2006.01)
*H01L 23/52*   (2006.01)

(52) U.S. Cl.
USPC .............. 257/737; 257/778; 257/E23.021

(58) Field of Classification Search
USPC ................... 257/737, 778, E23.021
See application file for complete search history.

(56) References Cited

U.S. PATENT DOCUMENTS

| | | | | |
|---|---|---|---|---|
| 4,604,044 | A * | 8/1986 | Hafele | 425/525 |
| 5,381,307 | A * | 1/1995 | Hertz et al. | 361/767 |
| 5,641,946 | A * | 6/1997 | Shim | 174/261 |
| 5,796,169 | A * | 8/1998 | Dockerty et al. | 257/780 |
| 5,796,590 | A * | 8/1998 | Klein | 361/774 |
| 6,175,157 | B1 * | 1/2001 | Morifuji | 257/777 |
| 6,614,111 | B2 * | 9/2003 | Iwatsu et al. | 257/737 |

FOREIGN PATENT DOCUMENTS

| | | |
|---|---|---|
| JP | 07-022538 | 1/1995 |
| JP | 09-162531 | 6/1997 |
| KR | 100192766 B1 | 1/1999 |

* cited by examiner

*Primary Examiner* — Nitin Parekh
(74) *Attorney, Agent, or Firm* — Myers Bigel Sibley & Sajovec

(57) ABSTRACT

A semiconductor package can include a substrate body having a first surface and a second surface. A semiconductor chip can be mounted on the first surface and a plurality of electrode pads can be on the second surface and selectively formed to have progressively smaller or larger sizes extending from a central region of the substrate body toward an outer edge of the substrate body based on a reflow soldering process warpage profile for the semiconductor package.

17 Claims, 19 Drawing Sheets

SEMICONDUCTOR PACKAGES HAVING WARPAGE COMPENSATION

CROSS-REFERENCE TO RELATED APPLICATIONS

This application claims the benefits of Korean Patent Application No. 10-2010-0027540, filed on Mar. 26, 2010, and Korean Patent Application No. 10-2010-0068584, filed on Jul. 15, 2010, in the Korean Intellectual Property Office, the disclosures of which are incorporated by reference herein in their entireties.

BACKGROUND

The inventive concept relates to electronics, and more particularly, to semiconductor packaging.

Research into a stack-chip-package including three-dimensionally stacked semiconductor chips or a stack-package including three-dimensionally stacked semiconductor packages is being actively performed.

SUMMARY

According to an aspect of the inventive concept, there is provided a semiconductor device including a semiconductor package with a substrate body including a first surface and a second surface. A semiconductor chip is mounted on the first surface, and a plurality of first electrode pads are on the second surface. A plurality of external contact electrodes are on the electrode pads. A mother board includes a plurality of second electrode pads that are electrically connected to the external contact electrodes, wherein at least one selected from the group consisting of heights of the external contact electrodes and pitches between the first electrode pads are determined to be different from each other according to a warpage direction of the semiconductor package in a soldering temperature range near a melting point of the external contact electrodes in a heat treatment process for forming the external contact electrodes.

In some embodiments, at least one selected from the group consisting of sizes of the first electrode pads and volumes of the external contact electrodes are determined to be different from each other according to the warpage direction of the semiconductor package in the soldering temperature range, and correspondingly, the heights of the external contact electrodes are determined to be different from each other.

In some embodiments, sizes of the second electrode pads are determined to be different from each other, corresponding to at least one selected from the group consisting of volumes of the external contact electrodes corresponding to the second electrode pads and sizes of the first electrode pads corresponding to the second electrode pads.

In some embodiments, pitches between the second electrode pads are determined to be different from each other, corresponding to pitches of the first electrode pads corresponding to the second electrode pads.

In some embodiments, the semiconductor package has a positive, that is, concave warpage in the soldering temperature range. Pitches between the first electrode pads are narrowed in a direction away from the center of the second surface. Pitches of the first electrode pads formed in a central region of the second surface are wider than pitches of the first electrode pads formed in an edge region of the second surface. The pitches of the first electrode pads formed in the central region of the second surface are identical to each other, and the pitches of the first electrode pads formed in the edge region of the second surface are identical to each other. Pitches of the first electrode pads formed in a central region of the second surface are narrowed in a direction away from the center of the second surface, and pitches of the first electrode pads formed in an edge region of the second surface are identical to each other.

In some embodiments, heights of the external contact electrodes formed in a central region of the second surface are smaller than heights of the external contact electrodes formed in an edge region of the second surface. Sizes of the first electrode pads formed in the central region of the second surface are greater than sizes of the first electrode pads formed in the edge region of the second surface. At least one of the first electrode pads formed in the central region of the second surface is a dummy pad. Volumes of the external contact electrodes formed in the central region of the second surface are smaller than volumes of the external contact electrodes formed in the edge region of the second surface.

In some embodiments, the semiconductor package further includes a protection layer that is formed on the second surface of the substrate body and exposes a portion of each of the first electrode pads, and sizes of the first electrode pads are sizes of the portions of the first electrode pads exposed by the protection layer.

In some embodiments, the semiconductor package further includes a protection layer that is formed on the second surface of the substrate body and exposes the first electrode pads, and sizes of the first electrode pads are actual sizes of the first electrode pads.

In some embodiments, the soldering temperature range is from about 220 degrees Centigrade to about 260 degrees Centigrade.

In some embodiments, the semiconductor device may further include a top semiconductor package stacked on the semiconductor package.

According to another aspect of the inventive concept, there is provided a stacked semiconductor package including: a first semiconductor package including a substrate body, a semiconductor chip mounted on an upper surface of the substrate body, and first electrode pads formed outside the semiconductor chip on the upper surface of the substrate body; external contact electrodes respectively formed on the first electrode pads; and a second semiconductor package that includes second electrode pads respectively electrically connected to the external contact electrodes and is stacked on the first semiconductor package via the external contact electrodes, wherein heights of the external contact electrodes are determined to be different from each other according to a warpage direction of at least one of the first and second semiconductor packages in a soldering temperature range near a melting point of the external contact electrodes in a heat treatment process for forming the external contact electrodes.

In some embodiments, at least one selected from the group consisting of sizes of the second electrode pads and volumes of the external contact electrodes are determined to be different from each other according to the warpage direction of at least one of the first and second semiconductor packages in the soldering temperature range. Sizes of the first electrode pads are determined to be different from each other according to at least one selected from the group consisting of the volumes of the external contact electrodes corresponding to the first electrode pads and the sizes of the second electrode pads corresponding to the first electrode pads.

According to another aspect of the inventive concept, there is provided a semiconductor package including: a substrate body having a first surface and a second surface; a semiconductor chip mounted on the first surface, and a plurality of electrode pads formed on the second surface, wherein at least one selected from the group consisting of sizes of the electrode pads and pitches between the electrode pads are determined to be different from each other according to a warpage direction of the semiconductor package in a soldering temperature range near a melting point of external contact electrodes in a heat treatment process for forming the external contact electrodes on the electrode pads.

The semiconductor package has a positive, that is, concave warpage in the soldering temperature range, and the sizes of the electrode pads formed in a central region of the second surface are greater than the sizes of the electrode pads formed in an edge region of the second surface. The semiconductor package has a positive, that is, concave warpage in the soldering temperature range, and the pitches between the electrode pads formed in a central region of the second surface are narrowed in a direction away from the center of the second surface.

According to another aspect of the inventive concept, there is provided a semiconductor package including a substrate body that has a first surface and a second surface where a semiconductor chip is mounted on the first surface. A plurality of electrode pads can be on the second surface and selectively formed to have progressively smaller or larger sizes extending from a central region of the substrate body toward an outer edge of the substrate body based on a reflow soldering process warpage profile for the semiconductor package.

According to another aspect of the inventive concept, the semiconductor package can also include a motherboard having the substrate body mounted thereon, where the motherboard includes external contact electrodes that are electrically coupled to respective ones of the pluralities of electrode pads, wherein the external contact electrodes have sizes that progressively increase or decrease from the central portion towards the outer edge.

According to another aspect of the inventive concept, a method of fabricating a semiconductor package can be provided by forming electrode pads on a first surface of a substrate body to have different sizes and/or different pitch from one another based on a reflow soldering process warpage profile for the semiconductor package. The semiconductor chip can then be mounted on a second surface of the substrate body.

According to another aspect of the inventive concept, there is provided a method of fabricating a semiconductor package, the method including: providing a substrate body having a first surface and a second surface; forming electrode pads on the first surface; and mounting a semiconductor chip on the second surface, wherein the forming of the electrode pads includes, determining at least one selected from the group consisting of sizes of the electrode pads and pitches between the electrode pads to be different from each other according to a reflow soldering profile of the semiconductor package; and forming the electrode pads on the first surface according to the determined physical property.

In some embodiments, the determining of the at least one selected from the group consisting of the sizes of the electrode pads and the pitches between the electrode pads is performed according to a warpage direction of the semiconductor package in the soldering temperature range in the reflow soldering profile of the semiconductor package.

In some embodiments, the method may further include forming a protection layer on the first surface and the electrode pads so as to expose a portion of each of the electrode pads, wherein the sizes of the electrode pads are sizes of portions of the electrode pads exposed by the protection layer.

In some embodiments, the method may further include forming a protection layer on the first surface so as to expose the electrode pads, wherein the sizes of the electrode pads are actual sizes of the electrode pads.

DESCRIPTION OF EMBODIMENTS ACCORDING TO THE INVENTIVE CONCEPT

Figure 1:
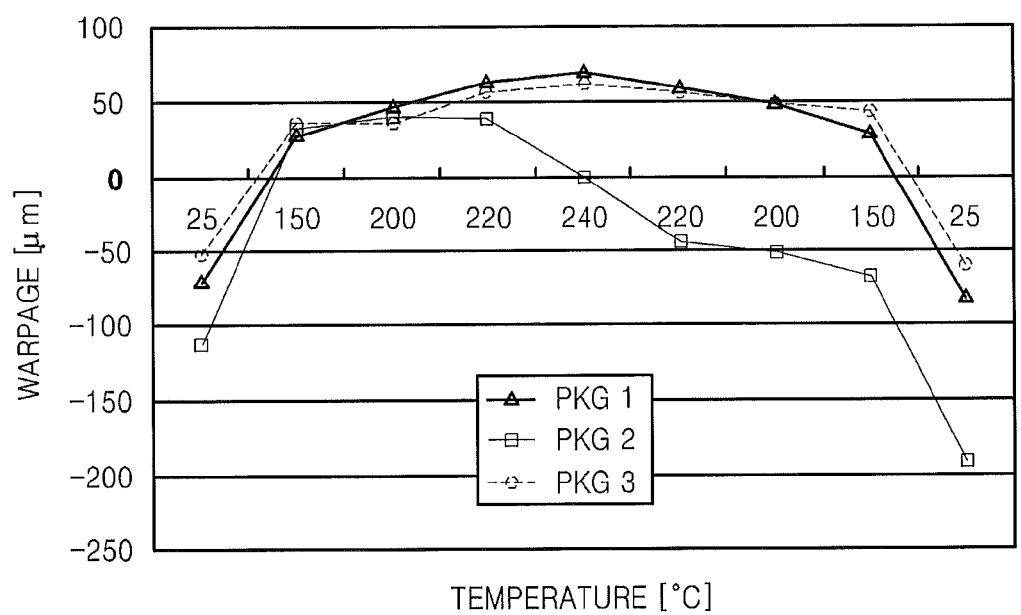
FIG. 1 is a graph of warpage direction and degree of semiconductor packages as a function of temperature when a reflow soldering process is performed on semiconductor packages in some embodiments according to the inventive concept.

Hereinafter, embodiments of the inventive concept will be described in detail with reference to the attached drawings.

Reference will now be made in detail to exemplary embodiments, examples of which are illustrated in the accompanying drawings. However, exemplary embodiments are not limited to the embodiments illustrated hereinafter, and the embodiments herein are rather introduced to provide easy and complete understanding of the scope and spirit of exemplary embodiments.

It will be understood that when a layer is referred to as being "on" another layer, it may be directly on another layer or an intervening layer may be present. In the drawings, thicknesses or sizes of layers are exaggerated for ease of description and clarity As used herein, the term "and/or" includes any and all combinations of one or more of the associated listed items.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Hereinafter, exemplary embodiments will be described herein with reference to sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. For example, a shape change resulting from manufacturing may be included. In addition, in the attached drawings, like reference numerals refer to like elements throughout.

A metal interconnection layer used herein, as used in the related art, may indicate a conductive trace, a lead, a land, or a pad, and these terms may not limit the scope of the inventive concept.

Figure 2:
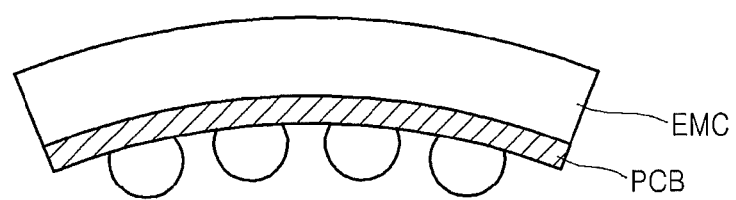
FIG. 2 is a schematic sectional view of a semiconductor package when a warpage value of FIG. 1 is negative.
Figure 3:
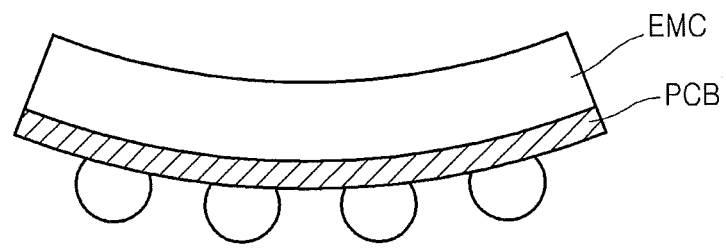
FIG. 3 is a schematic sectional view of a semiconductor package when a warpage value of FIG. 1 is positive.

FIG. 1 is a graph of warpage directions and degrees of semiconductor packages according to the ambient temperature, according to an embodiment of the inventive concept when a reflow soldering process is performed on the semiconductor packages. FIG. 2 is a schematic sectional view of a semiconductor package when a warpage value of FIG. 1 is negative. FIG. 3 is a schematic sectional view of a semiconductor package when a warpage value of FIG. 1 is positive.

As described herein, in some embodiments according to the inventive concept, semiconductor packages, in some examples as illustrated in FIG. 1, can have a negative warpage when cool, but may warp in the other direction when heated, such as when solder re-flow occurs. The warpage may cause the center and edges portions of the package to be spaced apart differently relative to another structure on which the packaged is mounted (e.g., during reflow). Therefore, in some embodiments according to the inventive concept, contacts can be formed to different heights, etc. to compensate for the different spacing between the package and the motherboard at the center compared to at the edges (and at other portions therebetween).

Referring to FIGS. 1 through 3, in FIG. 1, an x-axis represents temperature (unit: degrees Centigrade) and a y-axis represents warpage (unit:μm), and FIG. 1 shows reflow soldering profiles. In FIG. 1, a first semiconductor package (PKG1) is a bottom semiconductor package, a second semiconductor package (PKG2) is a top semiconductor package, and a third semiconductor package (PKG3) is a package-on-package (POP)-type stacked semiconductor package including a bottom semiconductor package and a top semiconductor package disposed on the bottom semiconductor package.

The first through third semiconductor packages PKG1, PKG2, and PKG3 may be subject to warping (referred to herein as "warpage") resulting from different coefficients of thermal expansion (CTE) between a substrate PCB and a molding portion EMC included in each of the semiconductor packages. In particular, when a reflow soldering process is performed on the first through third semiconductor packages PKG1, PKG2, and PKG3, warpage directions and warpage degrees of the first through third semiconductor packages PKG1, PKG2, and PKG3 may differ according to temperature.

In this regard, a reflow soldering process is a process of soldering performed by melting a prepared solder paste or solder cream. For example, a solder (Sn/Pb or Sn/Pb/Au) with a melting point less than that of a base metal of a joint portion is melted so that the solder as a liquid contacting a surface of the joint portion flows and wets the joint portion and, at the same time, a metal element forming the solder is diffused among particles of the base metal of the joint portion to form an alloy layer, thereby strongly combining metals.

For example, a reflow soldering process may be generally divided into different steps performed respectively in a heat-up temperature range from room temperature, for example, about 25 degrees Centigrade, to about 100 degrees Centigrade, a soaking temperature range from about 100 degrees Centigrade to about 200 degrees Centigrade, a reflow soldering temperature range from about 200 degrees Centigrade to a peak value (about 245 degrees Centigrade), and a cooling temperature range from about 200 degrees Centigrade to room temperature. In this regard, the reflow soldering temperature range is a temperature range near a melting point of a solder to be used. The melting point of the solder may vary according to components that are used to form the solder. For example, if the solder includes 96.5% tin (Sn) and 3.5% silver (Ag), the melting point of the solder is about 221 degrees Centigrade, and if the solder includes 99.3% Sn and 0.7% copper (Cu), the melting point of the solder is about 227 degrees Centigrade. Accordingly, according to the components of the solder, the reflow soldering temperature range may vary. The temperature ranges illustrated in FIG. 1 are examples and the inventive concept is not limited thereto.

When a reflow soldering process is performed to mount or stack a semiconductor package on either a mother board or another semiconductor package, solder balls are molten in the reflow soldering temperature range, flow into joints formed with respect to the mother board or another semiconductor package, and solidify. Accordingly, a warpage direction of a semiconductor package in the reflow soldering temperature range may not change even when the mounting or stacking of the semiconductor package is completed. That is, a warpage direction of the semiconductor package after the mounting or stacking of the semiconductor package is completed can depend on the warpage direction of the semiconductor package in the reflow soldering temperature range. Accordingly, in order to compensate for a warpage of a semiconductor package, in the reflow soldering temperature range, with reference to a warpage direction of the semiconductor package, heights of solder balls present between the semiconductor package and either a mother board or another semiconductor package can be controlled to be different from each other. For example, elements used to interface to underlying or overlying structures can be formed to have different heights based on the degree and/or direction of warping due to the reflow process. Moreover, the structures can be formed to be progressively higher or lower as a function of a distance from a region. For example, the height of the structure may progressively be decreased starting from the edge and moving toward a central portion based on a warpage profile for the device when exposed to the reflow process. Further, other dimensions of the structures can also be progressively changed, such as the pitch between the structures or the size of the exposed portion of the structure. In some embodiments according to the inventive concept, these progressive dimensional variations can be combined.

In addition, since, in a reflow soldering process, in the reflow soldering temperature range, a solder paste or a solder cream are melted, adjacent solder balls may be short-circuited. In particular, due to warpage of a semiconductor package, it is possible that adjacent solder balls are short-circuited by the melting when a gap between the semiconductor package and either a mother board or another semiconductor package is relatively small. Accordingly, in order to compensate for the warpage of the semiconductor package, in the reflow soldering temperature range, with reference to a warpage direction of the semiconductor package, heights of solder balls present between the semiconductor package and either a mother board or another semiconductor package need to be controlled to be different from each other.

In FIG. 1, the warpage directions and the warpage degrees were measured at a bottom surface of each of the semiconductor packages PKG1, PKG2, and PKG3. That is, each of the semiconductor packages PKG1, PKG2, and PKG3 includes the substrate PCB and the molding portion EMC disposed on an upper surface of the substrate PCB, and the warpage directions and the warpage degrees were measured at a lower surface of the substrate PCB. In this regard, a region that is to be referred when the warpage directions are evaluated, that is, regions in which warpage is 0 μm, may be regions corresponding to external contact electrodes corresponding to an average joint gap between each semiconductor package and a mother board in a temperature range in which a solder ball is solidified in a reflow soldering process.

The first semiconductor package PKG1, at room temperature, has a negative warpage, and thus, is convex upward as illustrated in FIG. 2. On the other hand, at high temperatures, that is, in the reflow soldering temperature range, the first semiconductor package PKG1 has a positive warpage, and thus, is convex downward as illustrated in FIG. 3. Thus, when the first semiconductor package PKG1 is mounted on a mother board, in the reflow soldering temperature range, a gap between a central portion of the first semiconductor package PKG1 and the mother board may be smaller than a gap between an edge portion of the first semiconductor package PKG1 and the mother board. Thus, in order to improve coplanarity of solder balls that are to be formed on the first semiconductor package PKG1, a height of a solder ball that is to be formed corresponding to the central portion of the first semiconductor package PKG1 may be less than a height of a solder ball that is to be formed corresponding to the edge portion of the first semiconductor package PKG1.

The second semiconductor package PKG2, at room temperature, has a negative warpage, and thus, is convex upward as illustrated in FIG. 2. On the other hand, when the temperature increases sufficiently, the second semiconductor package PKG2 has a positive warpage, and when the temperature reaches a temperature peak point of about 240 degrees Centigrade and decreases thereafter, the second semiconductor package PKG2 has a negative warpage, and thus, is convex upward as illustrated in FIG. 2. In this regard, the temperature peak point of about 240 degrees Centigrade is an example. For example, in another embodiment, the temperature peak point may instead be about 260 degrees Centigrade. Thus, when the second semiconductor package PKG2 is stacked on the first semiconductor package PKG1, in the reflow soldering temperature range, a gap between a central region of the second semiconductor package PKG2 and the central portion of the first semiconductor package PKG1 may be larger than a gap between an edge region of the second semiconductor package PKG2 and the edge portion of the first semiconductor package PKG1. Accordingly, in order to improve coplanarity of the first semiconductor package PKG1 and the second semiconductor package PKG2, a height of a solder ball that is to be formed corresponding to the edge region of the second semiconductor package PKG2 may be smaller than a height of a solder ball that is to be formed corresponding to a region of the second semiconductor package PKG2 closer to the central region of the second semiconductor package PKG2 than the edge region of the second semiconductor package PKG2.

The third semiconductor package PKG3 shows a behavior similar to that of the first semiconductor package PKG1. For example, the third semiconductor package PKG3, at room temperature, has a negative warpage, and thus, is convex upward as illustrated in FIG. 2. On the other hand, at high temperatures, that is, in the reflow soldering temperature range, the third semiconductor package PKG3 has a positive warpage, and thus, is convex downward as illustrated in FIG. 3. Thus, when the third semiconductor package PKG3 is mounted on a mother board, in the reflow soldering temperature range, a gap between a central portion of the third semiconductor package PKG3 and the mother board may be smaller than a gap between an edge portion of the third semiconductor package PKG3 and the mother board. Thus, in order to improve coplanarity of solder balls that are to be formed on the third semiconductor package PKG3, a height of a solder ball that is to be formed corresponding to the central portion of the third semiconductor package PKG3 may be less than a height of a solder ball that is to be formed corresponding to the edge portion of the third semiconductor package PKG3.

Figure 4:
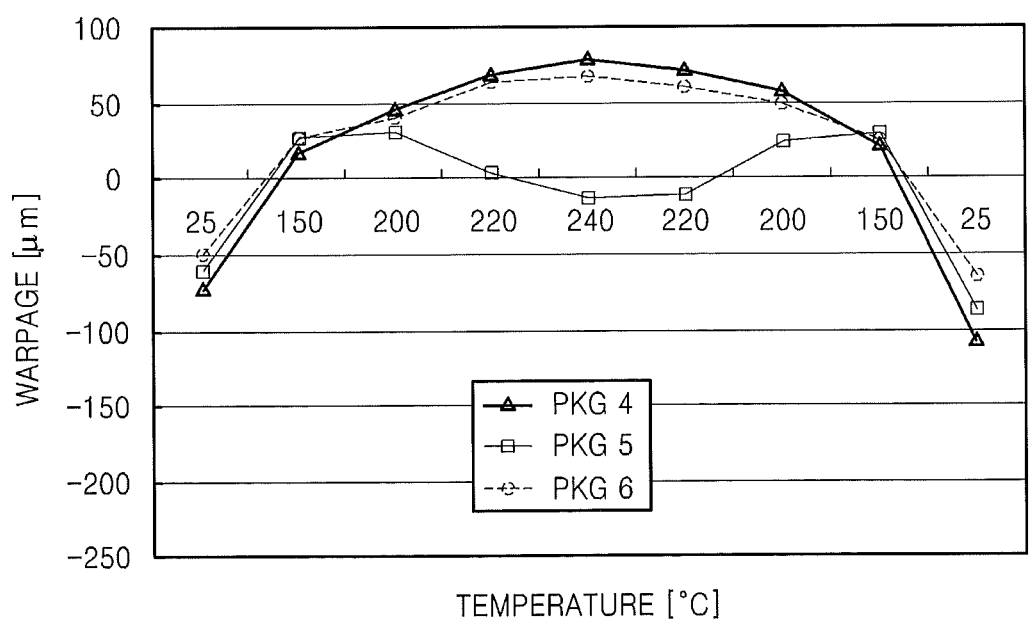
FIG. 4 is a graph of warpage direction and degree of semiconductor packages as a function of temperature when a reflow soldering process is performed on semiconductor packages in some embodiments according to the inventive concept.

FIG. 4 is a graph of warpage directions and degrees with respect to temperature of semiconductor packages according to the ambient temperature, according to another embodiment of the inventive concept when a reflow soldering process is performed on the semiconductor packages.

Referring to FIG. 4, in FIG. 4, an x-axis represents temperature (unit: degrees Centigrade) and a y-axis represents warpage (unit: μm). In FIG. 4, a fourth semiconductor package PKG4 is a bottom semiconductor package, a fifth semiconductor package PKG5 is a top semiconductor package, and a sixth semiconductor package PKG6 is a POP-type stacked semiconductor package including a bottom semiconductor package and a top semiconductor package disposed on the bottom semiconductor package.

Like in FIG. 1, in FIG. 4, the warpage directions and the warpage degrees were measured at a bottom surface of each of the fourth, fifth, and sixth semiconductor packages PKG4, PKG5, and PKG6. Since the fourth semiconductor package PKG4 shows a behavior similar to that of the first semiconductor package PKG1 of FIG. 1 and the sixth semiconductor package PKG6 shows a behavior similar to that of the third semiconductor package PKG3 of FIG. 1.

The fifth semiconductor package PKG5, at room temperature, has a negative warpage, and thus, is convex upward as illustrated in FIG. 2. On the other hand, when the temperature increases sufficiently, the second semiconductor package PKG2 has a positive warpage. However, when the temperature is in the range from about 220 degrees Centigrade to about 240 degrees Centigrade, the second semiconductor package PKG2 has a negative warpage, and when the temperature is decreased from about 220 degrees Centigrade to about 150 degrees Centigrade, the second semiconductor package PKG2 has a positive warpage, and thus, is convex downward as illustrated in FIG. 3. In this regard, the temperature ranges are examples and the inventive concept is not limited thereto. For example, in another embodiment, the fifth semiconductor package PKG5 may have a negative warpage in the temperature range of about 220 degrees Centigrade to 260 degrees Centigrade.

Accordingly, when the fifth semiconductor package PKG5 is stacked on the fourth semiconductor package PKG4 and a solder is solidified, the fourth and fifth semiconductor packages PKG4 and PKG5 all are convex downward. In this regard, the warpage degree of the fourth semiconductor package PKG4 is generally higher than the warpage degree of the fifth semiconductor package PKG5. For example, at a temperature of about 200 degrees Centigrade, the warpage degree of the fourth semiconductor package PKG4 is about 50 μm and the warpage degree of the fifth semiconductor package PKG5 is about 25 μm. Thus, a gap between a central region of the fourth semiconductor package PKG4 and a central region of the fifth semiconductor package PKG5 is larger than a gap between an edge region of the fourth semiconductor package PKG4 and an edge region of the fifth semiconductor package PKG5. Accordingly, in order to improve coplanarity of the fourth semiconductor package PKG4 and the fifth semiconductor package PKG5, a height of a solder ball that is to be formed corresponding to the edge region of the fifth semiconductor package PKG5 may be smaller than a height of a solder ball that is to be formed corresponding to a portion of the fifth semiconductor package PKG5 closer to the central region of the fifth semiconductor package PKG5 than the edge region of the fifth semiconductor package PKG5.

Figure 5:
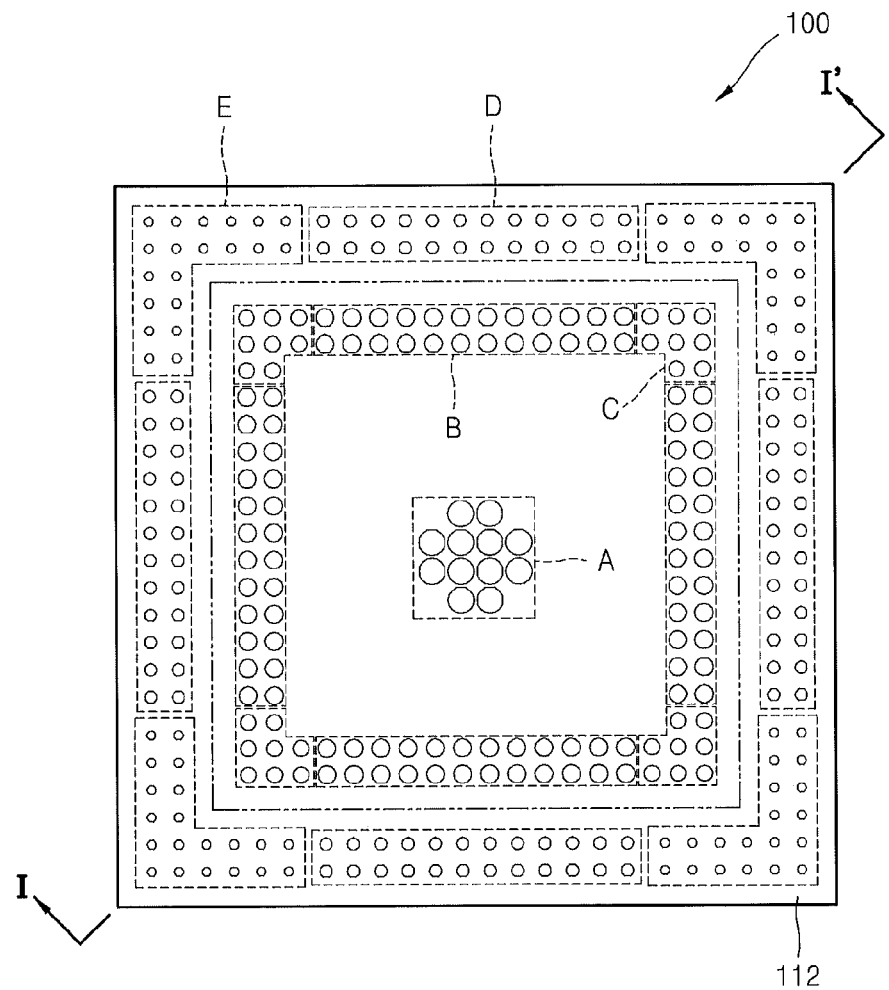
FIG. 5 is a bottom plan view of a semiconductor package according to an embodiment of the inventive concept.
Figure 6:
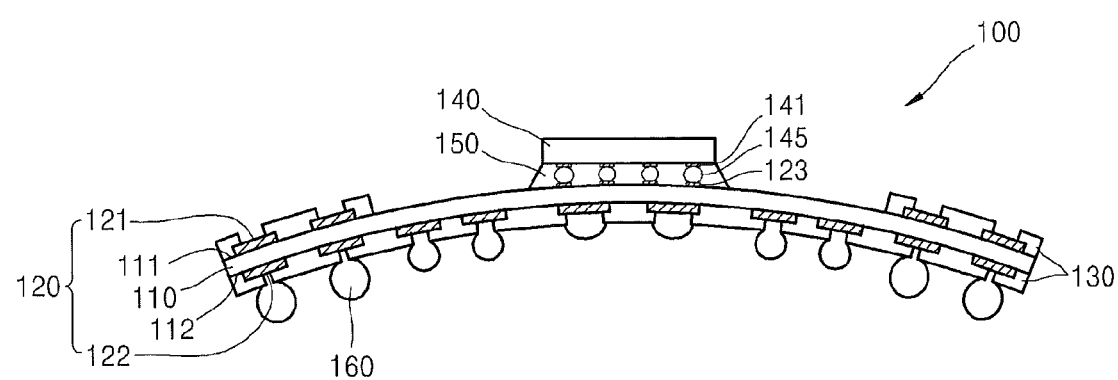
FIG. 6 is an example of a cross-sectional view taken along a line I-I' of FIG. 5.

FIG. 5 is a bottom plan view of a semiconductor package 100 according to an embodiment of the inventive concept. FIG. 6 is an example of a cross-sectional view taken along a line I-I' of FIG. 5.

Referring to FIGS. 5 and 6, the semiconductor package 100 includes a substrate body 110, a metal interconnection layer 120, a protection layer 130, a semiconductor chip 140, a molding member 150, and external contact electrodes 160. The semiconductor package 100 according to the present embodiment may be the first semiconductor package PKG1 described above. Thus, the semiconductor package 100, at room temperature, may have a negative warpage, and thus, is convex upward as illustrated in FIG. 2. On the other hand, at high temperatures, that is, in the reflow soldering temperature range, the semiconductor package 100 has a positive warpage, and thus, is convex downward as illustrated in FIG. 3. However, the inventive concept is not limited thereto, and, in another embodiment, the semiconductor package 100 may have a positive warpage at room temperature and the semiconductor package 100 may have a negative warpage at high temperatures.

The substrate body 110 is a square-shaped insulating plate having a given thickness and includes an upper surface 111 and a lower surface 112. In this regard, the substrate body 110 may be formed of one selected from the group consisting of a conventional resin or photosensitive liquid dielectric, a photosensitive dry-film dielectric, a polyimide flexible film, a thermally cured dry film, a thermally cured liquid dielectric, a resin coated copper foil (RCC), a thermoplastic, and a flexible resin. Alternatively, the substrate body 110 may instead be formed of a ceramic. The materials for forming the substrate body 110 are examples and the present embodiment is not limited thereto.

The metal interconnection layer 120 includes first electrode pads 121 formed on the upper surface 111 of the substrate body 110 and second electrode pads 122 formed on the lower surface 112 of the substrate body 110. Although not illustrated, the first electrode pads 121 are electrically connected to the second electrode pads 122 by vias passing through the substrate body 110, and at least one inner interconnection layer may be further formed in the substrate body 110. In this regard, the metal interconnection layer 120 may be formed of aluminum or a copper foil, and, in another embodiment, a surface of the metal interconnection layer 120 may be plated with tin (Sn), gold (Au), nickel (Ni), or lead (Pb). In order to form the metal interconnection layer 120, first, as well known in the art, a metal layers may be formed on each of the upper surface 111 and the lower surface 112 of the substrate body 110 by casting, laminating, or electroplating. Then, the metal layers are patterned to form the metal interconnection layer 120.

The protection layer 130 may be formed of an insulating material so as to protect the metal interconnection layer 120, and may cover the upper surface 111 and the lower surface 112 of the substrate body 110. In this regard, the protection layer 130 may be formed of a photo solder resist that is able to be patterned by lithography. For example, the protection layer 130 may be formed on the substrate body 110 and the metal interconnection layer 120, exposing a portion of a central portion of each of the first electrode pads 121 and a part of a central region of each of the second electrode pads 122. The resultant structure is referred as a solder mask defined (SMD)-type interconnection substrate. Thus, an exposure size of each of the first and second electrode pads 121 and 122 on the upper surface 111 and the lower surface 112 of the substrate body 110 may be dependent on a size of an opening defined by the protection layer 130.

As illustrated in FIG. 5, the lower surface 112 of the semiconductor package 100 includes a first region A corresponding to a central region of the semiconductor package 100, that is, a region on which the semiconductor chip 140 is to be mounted, a middle region outside the first region A, and an edge region outside the middle region. In this regard, the middle region is divided into a second region B corresponding to each side of the middle region and a third region C corresponding to each corner of the middle region, and the edge region is divided into a fourth region D corresponding to each side of the edge region and a fifth region E corresponding to each corner of the edge region. In this regard, the exposure sizes of the second electrode pads 122 formed on the lower surface 112 of the semiconductor package 100 may be different from each other according to location.

For example, if, in the reflow soldering temperature range, the semiconductor package 100 has a positive warpage, heights of the external contact electrodes 160 corresponding to the central region of the semiconductor package 100 may be less than the heights of the external contact electrodes 160 corresponding to the edge region of the semiconductor package 100. To do this, an average exposure size of the second electrode pads 122 formed in the first region A may be, for example, about 0.31 mm, which is the largest average exposure size; an average exposure size of the second electrode pads 122 formed in the second region B may be, for example, about 0.30 mm; an average exposure size of the second electrode pads 122 formed in the third region C may be, for example, about 0.29 mm; an average exposure size of the second electrode pads 122 formed in the fourth region D may be, for example, about 0.28 mm; and an average exposure size of the second electrode pads 122 formed in the fifth region E may be, for example, about 0.24 mm, which is the smallest average exposure size.

As described above, by setting the exposure sizes of the second electrode pads 122 formed in the first region A, that is, the central region of the lower surface 112 of the semiconductor package 100, to be the largest, even when the external contact electrodes 160 are formed having the same volume, the heights of the external contact electrodes 160 corresponding to the central region of the semiconductor package 100 may able to be set to be the smallest. In addition, spread of the external contact electrodes 160 in a lateral direction occurring when the external contact electrodes 160 melts in the reflow soldering temperature range may be reduced and thus short-circuiting of adjacent external contact electrodes 160 may be prevented.

The semiconductor chip 140 is mounted in a central region of the upper surface of 111 of the substrate body 110. The semiconductor chip 140 may be a volatile memory device, such as a dynamic random access memory (DRAM) or a static random access memory (SRAM); a non-volatile memory device, such as a flash memory; a photoelectron device; a logic device; a communication device; a digital signal processor; or a system-on-chip. In this regard, the semiconductor chip 140 may be mounted using a flip-chip method. For example, contact pads 141 formed on the semiconductor chip 140 are disposed in a direction facing the substrate body 110, and then, the contact pads 141 formed on the semiconductor chip 140 are electrically connected with bonding pads 123 formed on the upper surface 111 of the substrate body 110 by solder balls 145 that are conductive bumps.

The molding member 150 is filled between the semiconductor chip 140 and the upper surface of 111 of the substrate body 110 so as to protect an electrical connection between the semiconductor chip 140 and the solder balls 145. For example, the molding member 150 may be formed using a known underfill process using a capillary vessel phenomenon. Alternatively, a liquid film formed of a resin material is inserted between the semiconductor chip 140 and the upper surface of 111 of the substrate body 110 and then a thermal compression process or a reflow process may be performed on the semiconductor chip 140 and the substrate body 110 to form the molding member 150. By the thermal compression or reflowing, the liquid film is completely cured to relieve thermal or mechanical stress applied to the semiconductor chip 140 and the solder balls 145. In another embodiment, a region between the upper surface of 111 of the substrate body 110 and the semiconductor chip 140 may be completely filled with a thermo-curable resin such as EMC.

The external contact electrodes 160 are respectively formed on the second electrode pads 122 so as to mount or stack the semiconductor package 100 on either a mother board or another semiconductor package. In this regard, the external contact electrodes 160 may be formed of conductive bumps such as solder balls, solder bumps, or a solder paste, and may be aligned in a grid so as to fabricate a ball grid array (BGA) package. In this regard, in order to bond the second electrode pads 122 to the mother board or another semiconductor package via the external contact electrodes 160, a high-temperature heat treatment process, such as a wave soldering process or a reflow soldering process, may be performed. Hereinafter, bonding using a reflow soldering process will be described in detail. However, the inventive concept is not limited thereto, and the bonding may instead be performed using a wave soldering process.

In the present embodiment, the semiconductor package 100 has a positive warpage in the reflow soldering temperature range. Thus, the heights of the external contact electrodes 160 corresponding to the central region of the semiconductor package 100 need to be relatively small. To do this, volumes of the external contact electrodes 160 formed in the central region of the lower surface 112 of the semiconductor package 100 are set to be relatively small, and volumes of the external contact electrodes 160 formed in the edge region of the lower surface 112 of the semiconductor package 100 are set to be relatively large.

For example, when the external contact electrodes 160 are formed of solder balls, relatively small solder balls may be formed in the central region of the lower surface 112 of the semiconductor package 100, and relatively large solder balls may be formed in the edge region of the lower surface 112 of the semiconductor package 100. In addition, for example, when the external contact electrodes 160 are formed of a solder paste, in regard to a mask for screen/stencil printing, exposure sizes of the mask in the central region are to be relatively small and exposure sizes of the mask in the edge region are to be relatively large.

Thus, when all the exposure sizes of the second electrode pads 122 are identical to each other, the heights of the external contact electrodes 160 formed in the central region of the lower surface 112 may be set to be relatively low. In addition, spread of the external contact electrodes 160 in a lateral direction occurring when the external contact electrodes 160 melts in the reflow soldering temperature range may be reduced and thus short-circuiting of adjacent external contact electrodes 160 may be prevented.

As described above, by differing the exposure sizes of the second electrode pads 122 from each other or by differing the volumes of the external contact electrodes 160 from each other, the heights of the external contact electrodes 160 may be different from each other. The different heights may lead to an improvement in coplanarity of the external contact electrodes 160 formed on the semiconductor package 100. For example, an average height of the external contact electrodes 160 formed in the first region A may be about 0.2164 mm, an average height of the external contact electrodes 160 formed in the second region B may be about 0.2238 mm, an average height of the external contact electrodes 160 formed in the third region C may be about 0.2298 mm, an average height of the external contact electrodes 160 formed in the fourth region D may be about 0.2328 mm, and an average height of the external contact electrodes 160 formed in the fifth region E may be about 0.2492 mm.

In another embodiment, the external contact electrodes 160 may not be formed on at least one of the second electrode pads 122 formed in the central region of the lower surface 112. That is, at least one of the second electrode pads 122 formed in the central region of the lower surface 112 may be a dummy pad. For example, the external contact electrodes 160 may not be formed on the second electrode pads 122 located in a region in which a gap between the lower surface 112 of the semiconductor package 100 and the mother board is too small. By doing so, coplanarity of the external contact electrodes 160 formed on the semiconductor package 100 may be improved, and short-circuiting of adjacent external contact electrodes 160 may be prevented. As such, the semiconductor package 100 may be a combination package including a BGA and a land grid array (LGA).

Meanwhile, when the semiconductor package 100 has a negative warpage in the reflow soldering temperature range, the heights of the external contact electrodes 160 corresponding to the central region of the semiconductor package 100 need to be relatively large. To do this, the volumes of the external contact electrodes 160 may be set to the same and the exposure sizes of the second electrode pads 122 formed in the central region of the semiconductor package 100 may be set to be smaller than the exposure sizes of the second electrode pads 122 formed in the edge region of the semiconductor package 100. Alternatively, the exposure sizes of the second electrode pads 122 may be set to be the same and the volumes of the external contact electrodes 160 formed in the central region of the semiconductor package 100 may be set to be greater than the volumes of the external contact electrodes 160 formed in the edge region of the semiconductor package 100.

As such, according to an embodiment of the inventive concept, the volumes of the external contact electrodes 160 may be set to the same and the exposure sizes of the second electrode pads 122 may be set to be different from each other in the reflow soldering temperature range according to the warpage direction of the semiconductor package 100. According to another embodiment of the inventive concept, the exposure sizes of the second electrode pads 122 may be set to be the same and the volumes of the external contact electrodes 160 may be set to be different from each other in the reflow soldering temperature range according to the warpage direction of the semiconductor package 100. According to another embodiment of the inventive concept, the volumes of the external contact electrodes 160 and the exposure sizes of the second electrode pads 122 may be set to be different from each other in the reflow soldering temperature range according to the warpage direction of the semiconductor package 100.

Figure 7:
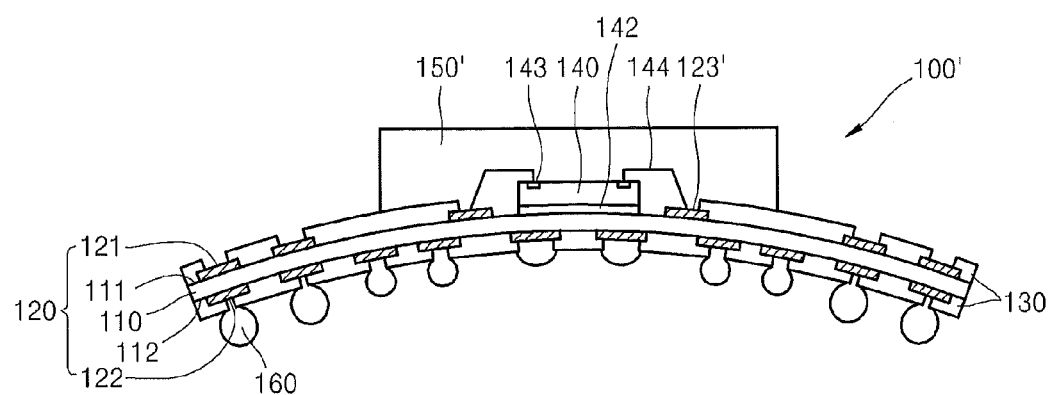
FIG. 7 is another example of a cross-sectional view taken along the line I-I' of FIG. 5.

FIG. 7 is another example of a cross-sectional view taken along the line I-I' of FIG. 5.

Referring to FIG. 7, a semiconductor package 100' includes the substrate body 110, the metal interconnection layer 120, the protection layer 130, the semiconductor chip 140, a molding member 150', and the external contact electrodes 160. The semiconductor package 100' according to the present embodiment is fabricated by modifying an element of the semiconductor package 100 of FIG. 6. Accordingly, hereinafter, differences between the semiconductor package 100' and the semiconductor package 100 of FIG. 6 will be described.

The semiconductor chip 140 is formed in the central region of the upper surface of 111 of the substrate body 110 using an adhesive layer 142, and in this regard, the semiconductor chip 140 is mounted by wire bonding. For example, the semiconductor chip 140 is placed in such a way that a portion of the semiconductor chip 140 including contact pads 143 faces upward, and then the contact pads 143 of the semiconductor chip 140 are electrically connected to bonding pads 123' formed on the substrate body 110 by using bonding wires 144.

The molding member 150' may be formed on the substrate body 110 so as to protect the semiconductor chip 140, the adhesive layer 142, and the bonding wires 144. For example, the molding member 150' may be disposed covering exposed portions of the semiconductor chip 140, the adhesive layer 142, and the bonding wires 144. The molding member 150' may include an insulating resin, for example, an EMC.

According to an embodiment of the inventive concept, the volumes of the external contact electrodes 160 may be identical to each other and the exposure sizes of the second electrode pads 122 may be set to be different from each other in the reflow soldering temperature range according to the warpage direction of the semiconductor package 100'. According to another embodiment of the inventive concept, the exposure sizes of the second electrode pads 122 may be set to be the same and the volumes of the external contact electrodes 160 may be set to be different from each other in the reflow soldering temperature range according to the warpage direction of the semiconductor package 100'. According to another embodiment of the inventive concept, the volumes of the external contact electrodes 160 and the exposure sizes of the second electrode pads 122 may be set to be different from each other in the reflow soldering temperature range according to the warpage direction of the semiconductor package 100'.

Figure 8:
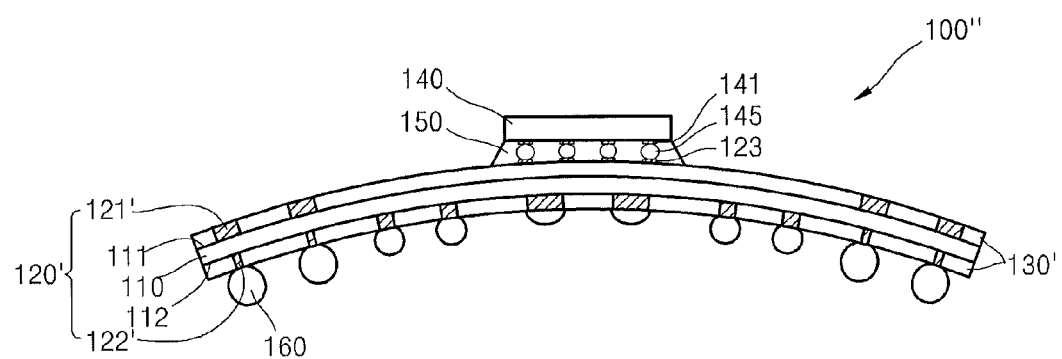
FIG. 8 is another example of a cross-sectional view taken along the line I-I' of FIG. 5.

FIG. 8 is another example of a cross-sectional view taken along the line I-I' of FIG. 5.

Referring to FIG. 8, a semiconductor package 100" may include the substrate body 110, a metal interconnection layer 120', a protection layer 130', the semiconductor chip 140, the molding member 150, and the external contact electrodes

160. The semiconductor package 100" according to the present embodiment is fabricated by modifying an element of the semiconductor package 100 of FIG. 6. Accordingly, hereinafter, differences between the semiconductor package 100" and the semiconductor package 100 of FIG. 6 will be described.

The metal interconnection layer 120' includes first electrode pads 121' formed on the upper surface of 111 of the substrate body 110 and second electrode pads 122' formed on the lower surface 112 of the substrate body 110. Although not illustrated, the first electrode pads 121' are electrically connected to the second electrode pads 122' by vias passing through the substrate body 110, and at least one inner interconnection layer may be further formed in the substrate body 110.

The protection layer 130' may be formed of an insulating material so as to protect the metal interconnection layer 120', and may cover the upper surface 111 and the lower surface 112 of the substrate body 110. For example, the protection layer 130' may be formed on the substrate body 110 and the metal interconnection layer 120' to expose an upper surface of each of the first electrode pad 121' and the second electrode pad 122'. The resultant structure is referred to as a non solder mask defined (NSMD)-type interconnection substrate. Accordingly, sizes of the exposed portions of the first and second electrode pads 121' and 122' of the semiconductor package 100" may be sizes of the first and second electrode pads 121' and 122'.

Accordingly, the sizes of the second electrode pads 122' may be set to be different from each other in the reflow soldering temperature range according to the warpage direction of the semiconductor package 100". In the present embodiment, the semiconductor package 100" has a positive warpage in the reflow soldering temperature range. Thus, the sizes of the second electrode pad 122' formed in the central region of the lower surface 112 of the substrate body 110 may be set to be relatively greater than the sizes of the second electrode pad 122' formed in the edge region of the lower surface 112 of the substrate body 110.

Figure 9:
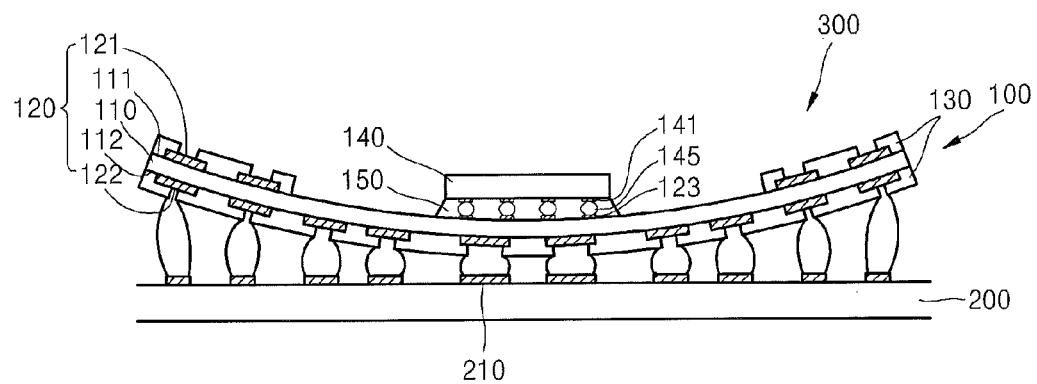
FIG. 9 is a cross-sectional view of a semiconductor device including a mother board and the semiconductor package of FIG. 6 mounted on the mother board in some embodiments according to the inventive concept.

FIG. 9 is a cross-sectional view of a semiconductor device 300 including a mother board 200 and the semiconductor package of FIG. 6 mounted on the mother board 200.

Referring to FIG. 9, the semiconductor device 300 includes the mother board 200 and the semiconductor package 100 mounted on the mother board 200

As described above, the semiconductor package 100 of FIG. 6 may be the first semiconductor package PKG1 of FIG. 1, and in this case, the semiconductor package 100 may be convex upward at room temperature, and the semiconductor package 100 may be convex downward at high temperatures. In particular, in a reflow soldering process, in a temperature range in which the external contact electrodes 160 are solidified (about 200 degrees Centigrade to about 220 degrees Centigrade), the semiconductor package 100 still has a positive warpage, and thus, the semiconductor package 100 is convex downward. Since a warpage direction of the semiconductor package 100 mounted on the mother board 200 is dependent on the warpage direction of the semiconductor package 100 in the temperature range in which the external contact electrodes 160 are solidified, in the semiconductor device 300, the semiconductor package 100 mounted on the mother board 200 is convex downward.

In the present embodiment, sizes of external contact terminals 210 formed on the mother board 200 may be determined corresponding to at least one selected from the group consisting of the exposure sizes of the second electrode pads 122 of semiconductor package 100 corresponding to the external contact terminals 210 and the volumes of the external contact electrodes 160 corresponding to the external contact terminals 210. Accordingly, when the semiconductor package 100 has a positive warpage, the external contact electrodes 160 have improved coplanarity, and with such a feature, the semiconductor package 100 may be mounted on the mother board 200.

For example, the exposure sizes of the second electrode pads 122 formed in the central region of the lower surface 112 of the semiconductor package 100 are greater than the exposure sizes of the second electrode pads 122 formed in the edge region of the lower surface 112 of the semiconductor package 100. Accordingly, the sizes of the external contact terminals 210 corresponding to the second electrode pads 122 formed in the central region of the lower surface 112 are greater than the sizes of the external contact terminals 210 corresponding to the second electrode pads 122 formed in the edge region of the lower surface 112.

In addition, the volumes of the external contact electrodes 160 formed in the central region of the lower surface 112 of the semiconductor package 100 are greater than the volumes of the external contact electrodes 160 formed in the edge region of the lower surface 112 of the semiconductor package 100. Accordingly, the sizes of the external contact terminals 210 corresponding to the external contact electrodes 160 formed in the central region of the lower surface 112 are greater than the sizes of the external contact terminals 210 corresponding to the external contact electrodes 160 formed in the edge region of the lower surface 112.

In this case, a protection layer (not shown) exposing either a portion of an upper surface or the entire upper surface of each of the external contact terminals 210 may be formed on the mother board 200. If the protection layer exposes a portion of the upper surface of each of the external contact terminals 210, the sizes of the external contact terminals 210 are determined according to openings defined by the protection layer. Meanwhile, if the protection layer exposes the entire upper surface of each of the external contact terminals 210, the sizes of the external contact terminals 210 are actual sizes of the external contact terminals 210.

Figure 10:
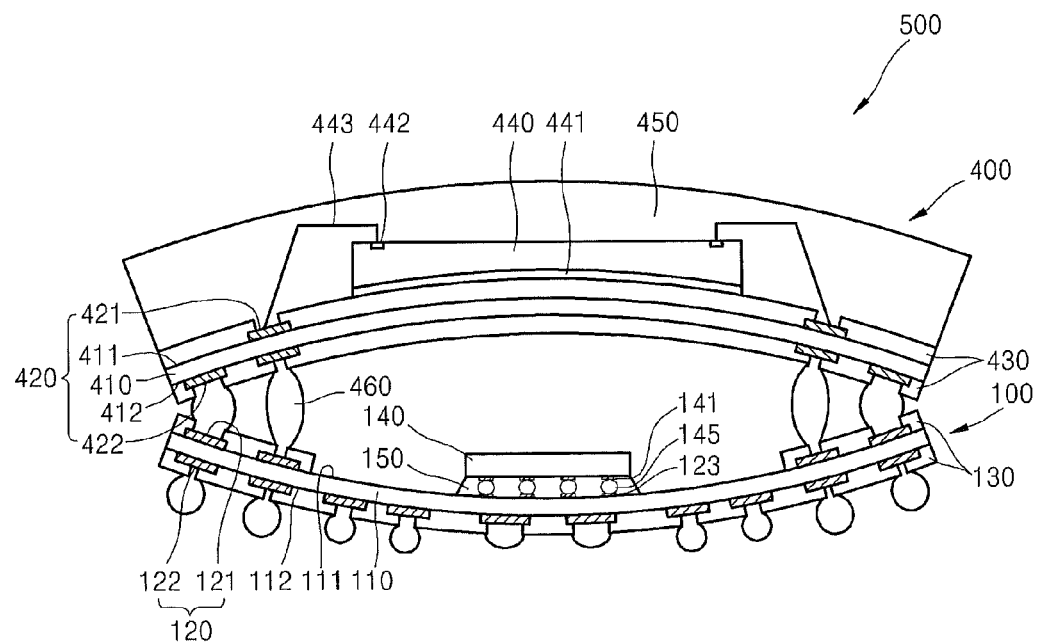
FIG. 10 is a cross-sectional view of a stacked semiconductor package including the semiconductor package of FIG. 6 in some embodiments according to the inventive concept.

FIG. 10 is a cross-sectional view of a stacked semiconductor package 500 including the semiconductor package of FIG. 6.

Referring to FIG. 10, the stacked semiconductor package 500 includes a bottom semiconductor package 100 and a top semiconductor package 400 stacked on the bottom semiconductor package 100. In the present embodiment, the bottom semiconductor package 100 corresponds to the semiconductor package 100 of FIG. 6.

The top semiconductor package 400 may include a substrate body 410, a metal interconnection layer 420, a protection layer 430, a semiconductor chip 440, a molding member 450, and external contact electrodes 460. Since the structure of the top semiconductor package 400 is similar to the structure of the bottom semiconductor package 100, descriptions of the bottom semiconductor package 100 may be also applied to the top semiconductor package 400.

The substrate body 410 is a square-shaped insulating plate having a given thickness and includes an upper surface 411 and a lower surface 412. The substrate body 410 may be embodied in the same manner as described with the substrate body 110 included in the bottom semiconductor package 100.

The metal interconnection layer 420 includes first electrode pads 421 formed on the upper surface 411 of the substrate body 410 and second electrode pads 422 formed on the lower surface 412 of the substrate body 410. Although not illustrated, the first electrode pads 421 are electrically connected to the second electrode pads 422 by vias passing through the substrate body 410, and at least one inner interconnection layer may be further formed in the substrate body 410.

The protection layer 430 may be formed of an insulating material so as to protect the metal interconnection layer 420, and may cover the upper surface 411 and the lower surface 412 of the substrate body 410. For example, the protection layer 430 may be formed on the substrate body 410 and the metal interconnection layer 420, exposing a portion of a central portion of each of the first electrode pads 421 and a portion of a central portion of each of the second electrode pads 422. However, in another embodiment, the protection layer 430 may be formed on the substrate body 410 to expose the entire upper surface of each of the first electrode pads 421 and the second electrode pads 422.

The semiconductor chip 440 is formed in a central region of the upper surface of the substrate body 410 using an adhesive layer 441, and in this regard, the semiconductor chip 440 may be mounted by wire bonding. However, in another embodiment, the semiconductor chip 440 may instead be mounted by flip-chip bonding. The molding member 450 may be formed on the entire upper surface 411 of the substrate body 410 so as to protect the semiconductor chip 440, the adhesive layer 441, and the bonding wire 443.

The external contact electrodes 460 may be respectively formed on the second electrode pads 422 so as to stack the top semiconductor package 400 on the bottom semiconductor package 100. In this regard, bonding of the second electrode pads 422 and the bottom semiconductor package 100 via the external contact electrodes 460 may be performed by a high-temperature heat treatment process such as a wave soldering process or a reflow soldering process. Hereinafter, the bonding by using a reflow soldering process will be described in detail. However, the inventive concept is not limited thereto. For example, the bonding may be instead performed using a wave soldering process.

In the present embodiment, the bottom semiconductor package 100 may be the first semiconductor package PKG1 of FIG. 1 and the top semiconductor package 400 may be the second semiconductor package PKG2 of FIG. 1. Accordingly, in a temperature range in which the external contact electrodes 460 are solidified, the bottom semiconductor package 100 has a positive warpage and the top semiconductor package 400 has a negative warpage. Since a warpage direction of the top semiconductor package 400 stacked on the bottom semiconductor package 100 is dependent on the warpage directions of the bottom semiconductor package 100 and the top semiconductor package 400 in the temperature range in which the external contact electrodes 460 are solidified, in the stacked semiconductor package 500, the top semiconductor package 400 stacked on the bottom semiconductor package 100 is convex upward.

In this regard, a gap between the top semiconductor package 400 and the bottom semiconductor package 100 increases in a direction from an edge region to a central region of the stacked semiconductor package 500. Accordingly, in order to fabricate the stacked semiconductor package 500 to be as thin as possible, heights of the external contact electrodes 460 formed in an edge region of the lower surface 412 of the top semiconductor package 400 may be set to be relatively small and heights of the external contact electrodes 460 formed in a region of the lower surface 412 closer to a central region of the lower surface 412 than the edge region of the lower surface 412 may be set to be relatively great.

Thus, when the external contact electrodes 460 have the same volume, exposure sizes of the second electrode pads 422 formed in the edge region of the lower surface 412 of the top semiconductor package 400 may be set to be greater than exposure sizes of the second electrode pads 422 formed in the region of the lower surface 412 closer to the central region of the lower surface 412 than the edge region of the lower surface 412. In addition, when the second electrode pads 422 have the same exposure size, the volumes of the external contact electrodes 460 formed in the edge region of the lower surface 412 of the top semiconductor package 400 may be set to be smaller than the volumes of the external contact electrodes 460 formed in the region of the lower surface 412 closer to the central region of the lower surface 412 than the edge region of the lower surface 412.

Figure 11:
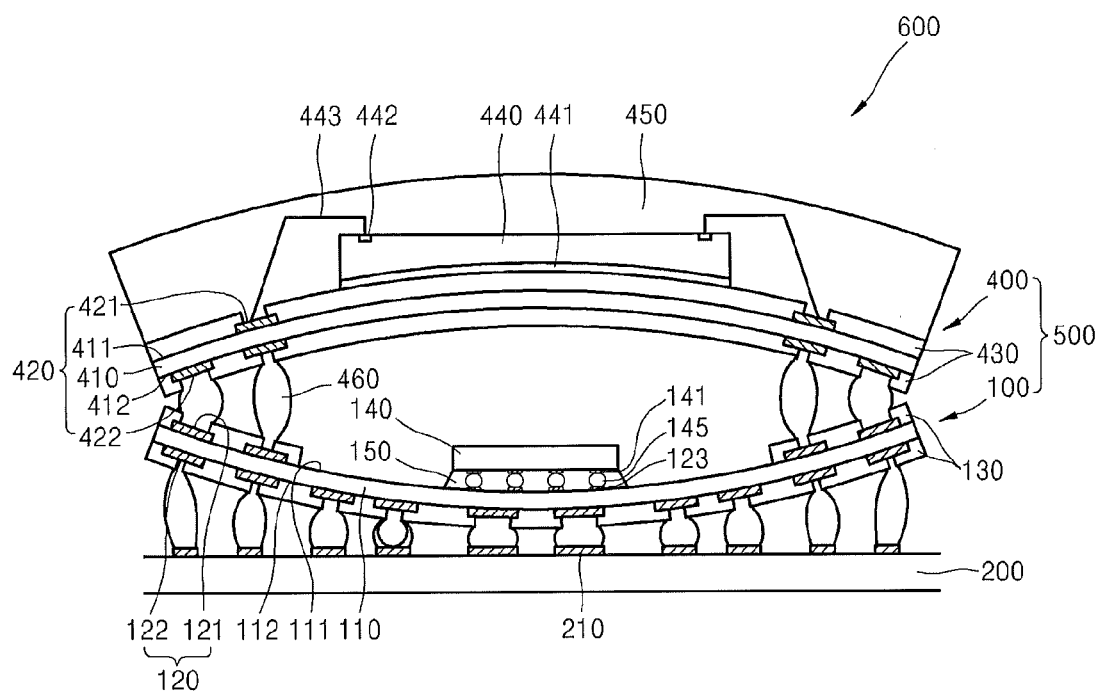
FIG. 11 is a cross-sectional view of a semiconductor device including a mother board and the stacked semiconductor package of FIG. 10 mounted on the mother board in some embodiments according to the inventive concept.

FIG. 11 is a cross-sectional view of a semiconductor device 600 including the stacked semiconductor package 500 of FIG. 10.

Referring to FIG. 11, the semiconductor device 600 includes a mother board 200 and the stacked semiconductor package 500 mounted on the mother board 200. In the present embodiment, the stacked semiconductor package 500 corresponds to the stacked semiconductor package 500 of FIG. 10.

In this regard, the stacked semiconductor package 500 may be the third semiconductor package PKG3 of FIG. 1. Accordingly, at room temperature, the stacked semiconductor package 500 is concave upward, and at high temperatures, the stacked semiconductor package 500 is concave downward. In particular, in a reflow soldering process, in the temperature range in which the external contact electrodes 160 are solidified (about 200 degrees Centigrade to about 220 degrees Centigrade), the stacked semiconductor package 500 still has a positive warpage and thus is concave downward. Since a warpage direction of the stacked semiconductor package 500 mounted on the mother board 200 is dependent on the warpage direction of the stacked semiconductor package 500 in the temperature range in which the external contact electrodes 160 are solidified, in the semiconductor device 600, the semiconductor package 500 mounted on the mother board 200 is convex downward.

In the present embodiment, sizes of external contact terminals 210 formed on the mother board 200 may be determined corresponding to at least one selected from the group consisting of the sizes of the second electrode pads 122 of semiconductor package 100 corresponding to the external contact terminals 210 and the volumes of the external contact electrodes 160 corresponding to the external contact terminals 210. Accordingly, when the semiconductor package 100 has a positive warpage, the external contact electrodes 160 have improved coplanarity, and with such a feature, the semiconductor package 100 may be mounted on the mother board 200.

For example, the exposure sizes of the second electrode pads 122 formed in the central region of the lower surface 112 of the semiconductor package 100 are greater than the exposure sizes of the second electrode pads 122 formed in the edge region of the lower surface 112 of the semiconductor package 100. Accordingly, the sizes of the external contact terminals 210 corresponding to the second electrode pads 122 formed in the central region of the lower surface 112 are greater than the sizes of the external contact terminals 210 corresponding to the second electrode pads 122 formed in the edge region of the lower surface 112.

In addition, the volumes of the external contact electrodes 160 formed in the central region of the lower surface 112 of the semiconductor package 100 are greater than the volumes of the external contact electrodes 160 formed in the edge region of the lower surface 112 of the semiconductor package 100. Accordingly, the sizes of the external contact terminals 210 corresponding to the external contact electrodes 160 formed in the central region of the lower surface 112 are greater than the sizes of the external contact terminals 210 corresponding to the external contact electrodes 160 formed in the edge region of the lower surface 112.

In this case, a protection layer (not shown) exposing either a portion of an upper surface or the entire upper surface of each of the external contact terminals 210 may be formed on the mother board 200. If the protection layer exposes a portion of the upper surface of each of the external contact terminals 210, the sizes of the external contact terminals 210 are determined according to openings defined by the protection layer. Meanwhile, if the protection layer exposes the entire upper surface of each of the external contact terminals 210, the sizes of the external contact terminals 210 are actual sizes of the external contact terminals 210.

Figure 12:
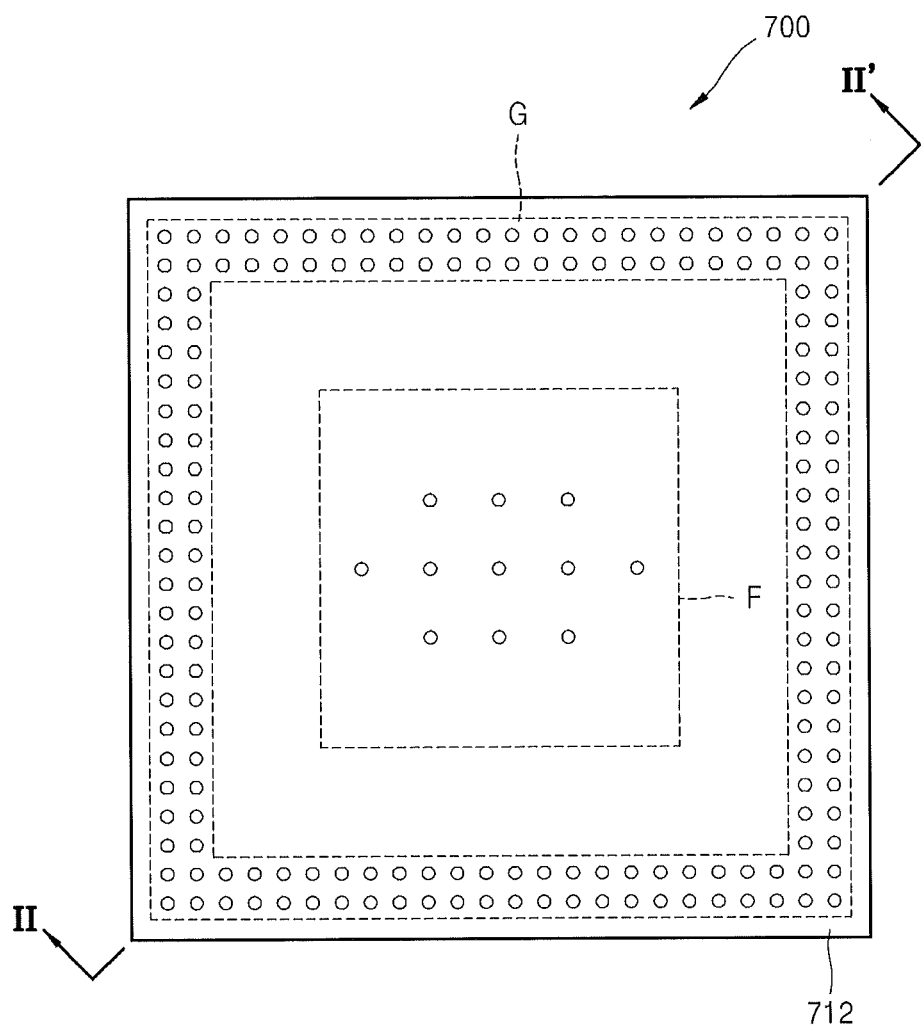
FIG. 12 is a bottom plan view of a semiconductor package according to another embodiment of the inventive concept in some embodiments according to the inventive concept.
Figure 13:
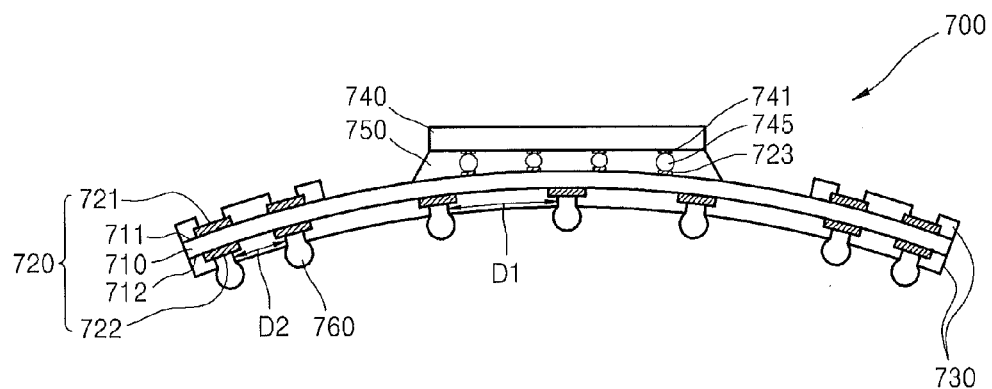
FIG. 13 is an example of a cross-sectional view taken along a line II-IP of FIG. 12 in some embodiments according to the inventive concept.

FIG. 12 is a bottom plan view of a semiconductor package 700 according to another embodiment of the inventive concept. FIG. 13 is an example of a cross-sectional view taken along a line II-IF of FIG. 12.

Referring to FIGS. 12 and 13, the semiconductor package 700 includes a substrate body 710, a metal interconnection layer 720, a protection layer 730, a semiconductor chip 740, a molding member 750, and external contact electrodes 760. The semiconductor package 700 according to the present embodiment may be the first semiconductor package PKG1 described above. Thus, the semiconductor package 700, at room temperature, may have a negative warpage, and thus, is convex upward as illustrated in FIG. 2. On the other hand, at high temperatures, that is, in the reflow soldering temperature range, the semiconductor package 700 has a positive warpage, and thus, is convex downward as illustrated in FIG. 3. However, the inventive concept is not limited thereto, and, in another embodiment, the semiconductor package 700 may have a positive warpage at room temperature and a negative warpage at high temperatures.

The substrate body 710 is a square-shaped insulating plate having a given thickness and includes an upper surface 711 and a lower surface 712. In this regard, the substrate body 710 may be embodied in substantially the same manner as described with the substrate body 110 of FIG. 6.

The metal interconnection layer 720 includes first electrode pads 721 formed on the upper surface 711 of the substrate body 710 and second electrode pads 722 formed on the lower surface 712 of the substrate body 710. Although not illustrated, the first electrode pads 721 may be electrically connected to the second electrode pads 722 by vias passing through the substrate body 710, and at least one inner interconnection layer may be further formed in the substrate body 710. In this regard, the metal interconnection layer 720 may be embodied in substantially the same manner as described with the metal interconnection layer 120 of FIG. 6.

The protection layer 730 may be formed of an insulating material so as to protect the metal interconnection layer 720, and may cover the upper surface 711 and the lower surface 712 of the substrate body 710. In this regard, the protection layer 730 may be embodied in substantially the same manner as described with the protection layer 130 of FIG. 6.

The semiconductor chip 740 is mounted in a central region of the upper surface 711 of the substrate body 710. The semiconductor chip 740 may be embodied in substantially the same manner as described with the semiconductor chip 140 of FIG. 6. In this regard, the semiconductor chip 740 may be mounted using a flip-chip method. For example, contact pads 741 formed on the semiconductor chip 740 are disposed in a direction facing the substrate body 710, and then, the contact pads 741 formed on the semiconductor chip 740 are electrically connected with bonding pads 723 formed on the upper surface 711 of the substrate body 710 by solder balls 745 that are conductive bumps.

The molding member 750 is filled between the semiconductor chip 740 and the upper surface of 711 of the substrate body 710 so as to protect an electrical connection between the semiconductor chip 740 and the solder balls 745. For example, the molding member 750 may be embodied in substantially the same manner as described with the molding member 150 of FIG. 6.

The external contact electrodes 760 are respectively formed on the second electrode pads 722 so as to mount or stack the semiconductor package 700 on either a mother board or another semiconductor package. In this regard, the external contact electrodes 760 may be may be embodied in substantially the same manner as described with the external contact electrodes 160 of FIG. 6.

Referring to FIG. 12, the lower surface 712 of the semiconductor package 700 may be divided into a central region F on which the semiconductor chip 740 is to be mounted and an edge region G outside the central region F. In this regard, pitches between the second electrode pads 722 formed on the lower surface 712 of the semiconductor package 700 may vary according to location. For example, the pitches between the second electrode pads 722 formed on the lower surface 712 of the semiconductor package 700 may be different from each other according to the warpage direction of the semiconductor package 700 in the reflow soldering temperature range. Although, in the present embodiment, the lower surface 712 of the semiconductor package 700 is divided into the central region F and the edge region G, the inventive concept is not limited thereto. For example, in another embodiment, the semiconductor package 700 may be instead divided into a central region, a middle region outside the central region, and an edge region outside the middle region.

If the semiconductor package 700 has a positive warpage in the reflow soldering temperature range, it is possible that the external contact electrodes 760 formed in the central region F of the semiconductor package 700 may be short-circuited in a reflow soldering process. However, in the present embodiment, pitches D1 between the second electrode pads 722 formed in the central region F of the semiconductor package 700 may be relatively wider than pitches D2 between the second electrode pads 722 formed in the edge region G. Thus, even when the semiconductor package 700 is concave downward in a reflow soldering process, short-circuiting of the external contact electrodes 760 that are to be formed in the central region F may be prevented.

For example, in an embodiment, the pitches D1 between the second electrode pads 722 formed in the central region F may be identical to each other, the pitches D2 between the second electrode pads 722 formed in the edge region G may be identical to each other, and the pitches D1 between the second electrode pads 722 formed in the central region F may be wider than the pitches D2 between the second electrode pads 722 formed in the edge region G.

In another embodiment, the pitches D1 between the second electrode pads 722 formed in the central region F may be different from each other, the pitches D2 between the second electrode pads 722 formed in the edge region G may be identical to each other, and the pitches D1 between the second electrode pads 722 formed in the central region F may be gradually narrowed in a direction away from the center of the semiconductor package 700.

In another embodiment, the pitches D1 of the second electrode pads 722 formed in the central region F may be different from each other, the pitches D2 of the second electrode pads 722 formed in the edge region G may be different from each other, and the pitches between the second electrode pads 722 in the central region F and the edge region G are gradually narrowed in a direction away from the center of the semiconductor package 700.

Accordingly, even when sizes of the second electrode pads 722 are identical to each other or volumes of the external contact electrodes 760 are identical to each other, since the pitches D1 between the second electrode pads 722 formed in the central region F are wider than the pitches D2 between the second electrode pads 722 formed in the edge region G, short-circuiting of the external contact electrodes 760 in the reflow soldering temperature range may be prevented.

Meanwhile, if the semiconductor package 700 has a negative warpage in the reflow soldering temperature range, the pitches D2 between the second electrode pads 722 formed in the edge region G may be wider than the pitches D1 between the second electrode pads 722 formed in the central region F. In this regard, even when the sizes of the second electrode pads 722 are identical to each other or the volumes of the external contact electrodes 760 are identical to each other, short-circuiting of the external contact electrodes 760 that are to be formed in the edge region G in the reflow soldering temperature range may be prevented.

Figure 14:
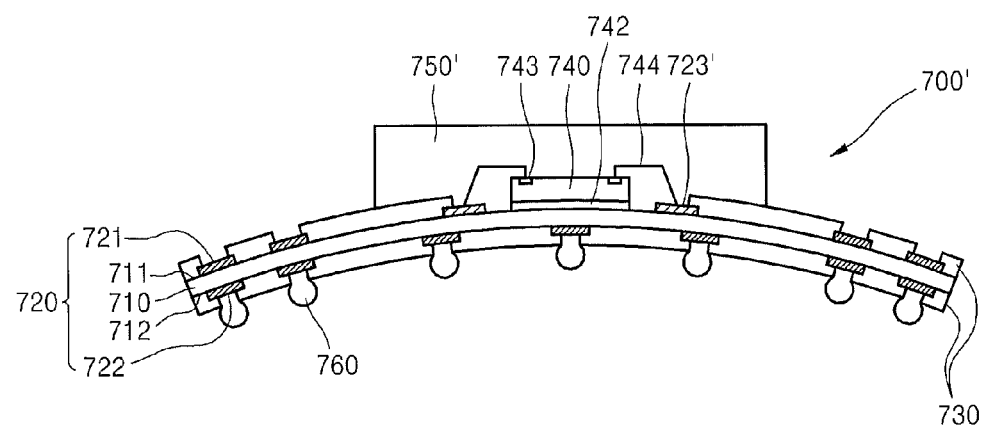
FIG. 14 is another example of a cross-sectional view taken along the line II-IF of FIG. 12 in some embodiments according to the inventive concept.

FIG. 14 is another example of a cross-sectional view taken along the line of FIG. 12.

Referring to FIG. 14, a semiconductor package 700' includes the substrate body 710, the metal interconnection layer 720, the protection layer 730, the semiconductor chip 740, a molding member 750', and the external contact electrodes 760. The semiconductor package 700' according to the present embodiment is fabricated by modifying an element of the semiconductor package 700 of FIG. 13. Accordingly, hereinafter, differences between the semiconductor package 700' and the semiconductor package 700 of FIG. 13 will be described.

The semiconductor chip 740 is formed in the central region of the upper surface 711 of the substrate body 710 using an adhesive layer 742, and in this regard, the semiconductor chip 740 is mounted by wire bonding. For example, the semiconductor chip 740 is placed in such a way that a portion of the semiconductor chip 740 including contact pads 743 faces upward, and then the contact pads 743 of the semiconductor chip 740 are electrically connected to bonding pads 723' formed on the substrate body 710 by using bonding wires 744.

The molding member 750' may be formed on the substrate body 710 so as to protect the semiconductor chip 740, the adhesive layer 742, and the bonding wires 744. For example, the molding member 750' may be embodied in substantially the same manner as described with the molding member 150' of FIG. 7.

Figure 15:
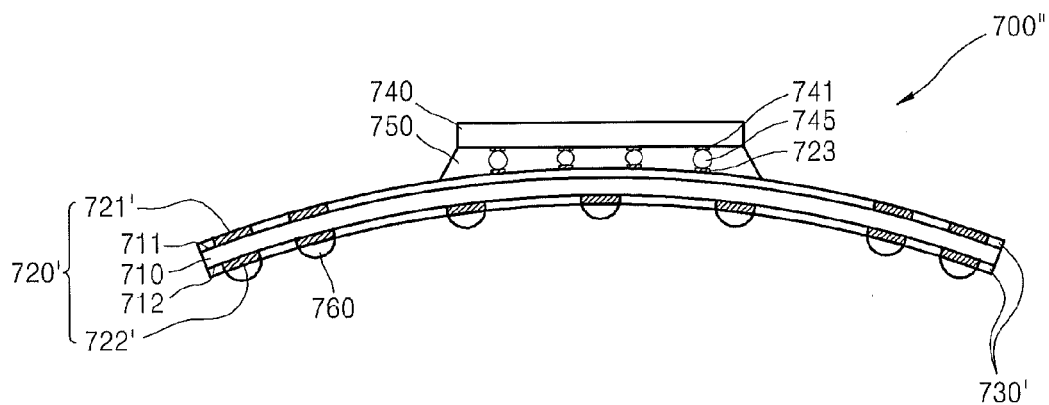
FIG. 15 is another example of a cross-sectional view taken along the line II-IF of FIG. 12 in some embodiments according to the inventive concept.

FIG. 15 is another example of a cross-sectional view taken along the line of FIG. 12.

Referring to FIG. 15, a semiconductor package 700" may include the substrate body 710, a metal interconnection layer 720', a protection layer 730', the semiconductor chip 740, the molding member 750, and the external contact electrodes 760. The semiconductor package 700" according to the present embodiment is fabricated by modifying an element of the semiconductor package 700 of FIG. 13. Accordingly, hereinafter, differences between the semiconductor package 700" and the semiconductor package 700 of FIG. 13 will be described.

The metal interconnection layer 720' includes first electrode pads 721' formed on the upper surface of 711 of the substrate body 710 and second electrode pads 722' formed on the lower surface 712 of the substrate body 710. In this regard, the metal interconnection layer 720' may be embodied in substantially the same manner as described with the metal interconnection layer 120' of FIG. 8.

The protection layer 730' may be formed of an insulating material so as to protect the metal interconnection layer 720', and may cover the upper surface 711 and the lower surface 712 of the substrate body 710. In this regard, protection layer 730' may be embodied in substantially the same manner as described with the protection layer 130' of FIG. 8.

Figure 16:
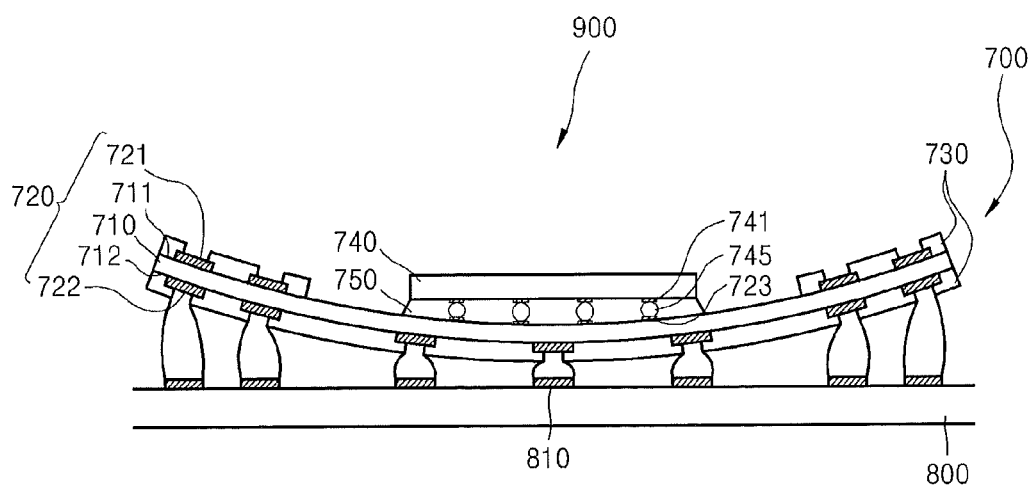
FIG. 16 is a cross-sectional view of a semiconductor device including a mother board and the semiconductor package of FIG. 13 mounted on the mother board in some embodiments according to the inventive concept.

FIG. 16 is a cross-sectional view of a semiconductor device 900 including a mother board 800 and the semiconductor package 700 of FIG. 13 mounted on the mother board 800.

Referring to FIG. 16, the semiconductor device 900 includes the mother board 800 and the semiconductor package 700 mounted on the mother board 800. In the present embodiment, the semiconductor package 700 is the semiconductor package 700 of FIG. 13.

As described above, the semiconductor package 700 of FIG. 13 may be the first semiconductor package PKG1 of FIG. 1. Thus, the semiconductor package 700 may be convex upward at room temperature, and the semiconductor package 700 may be convex downward at high temperatures. In particular, in a reflow soldering process, in a temperature range in which the external contact electrodes 760 are solidified (about 200 degrees Centigrade to about 220 degrees Centigrade), the semiconductor package 700 still has a positive warpage, and thus, the semiconductor package 700 is convex downward. Since a warpage direction of the semiconductor package 700 mounted on the mother board 800 is dependent on the warpage direction of the semiconductor package 700 in the temperature range in which the external contact electrodes 760 are solidified, in the semiconductor device 900, the semiconductor package 700 mounted on the mother board 800 is convex downward.

In the present embodiment, pitches between external contact terminals 810 formed on the mother board 800 may be determined corresponding to the pitches between the second electrode pads 722 of the semiconductor package 700 corresponding to the external contact terminals 810. For example, the pitches between the second electrode pads 722 formed in the central region F of the lower surface 712 of the semiconductor package 700 may be wider than the pitches between the second electrode pads 722 formed in the edge region G of the lower surface 712 of the semiconductor package 700. Accordingly, the pitches between the external contact terminals 810 corresponding to the second electrode pads 722 formed in the central region F of the lower surface 712 may be wider than the pitches between the external contact terminals 810 corresponding to the second electrode pads 722 formed in the edge region G of the lower surface 712.

Figure 17:
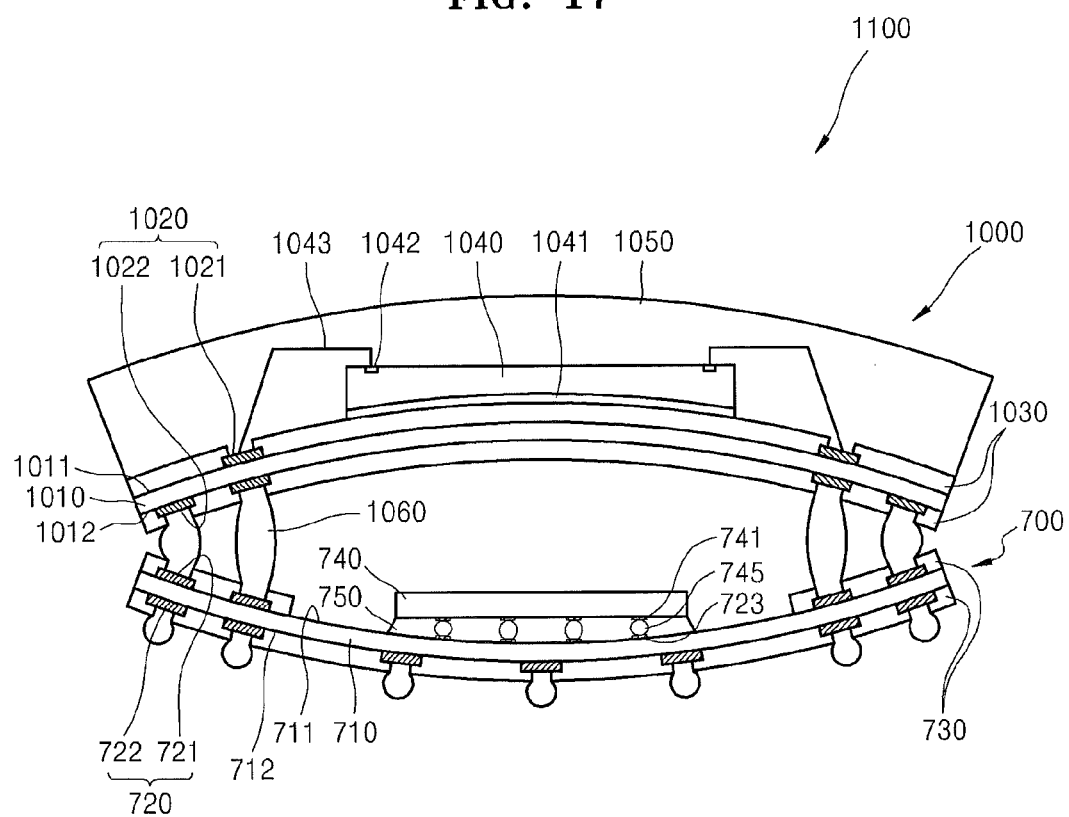
FIG. 17 is a cross-sectional view of a stacked semiconductor package including the semiconductor package of FIG. 13.

FIG. 17 is a cross-sectional view of a stacked semiconductor package 1100 including the semiconductor package 700 of FIG. 13.

Referring to FIG. 17, the stacked semiconductor package 1100 includes a bottom semiconductor package 700 and a top semiconductor package 1000 stacked on the bottom semiconductor package 700. In the present embodiment, the bottom semiconductor package 700 is the semiconductor package 700 of FIG. 13.

The top semiconductor package 1000 may include a substrate body 1010, a metal interconnection layer 1020, a protection layer 1030, a semiconductor chip 1040, a molding member 1050, and external contact electrodes 1060. Since the structure of the top semiconductor package 1000 may be similar to the structure of the bottom semiconductor package 700, descriptions of the bottom semiconductor package 700 described above may be also applied to the top semiconductor package 1000.

The substrate body 1010 is a square-shaped insulating plate having a given thickness and includes an upper surface 1011 and a lower surface 1012. The substrate body 1010 may be embodied in substantially the same manner as described with the substrate body 710 included in the bottom semiconductor package 700.

The metal interconnection layer 1020 includes first electrode pads 1021 formed on the upper surface 1011 of the substrate body 1010 and second electrode ppds 1022 formed on the lower surface 1012 of the substrate body 1010. Although not illustrated, the first electrode pads 1021 are electrically connected to the second electrode pads 1022 by vias passing through the substrate body 1010, and at least one inner interconnection layer may be further formed in the substrate body 1010.

The protection layer 1030 may be formed of an insulating material so as to protect the metal interconnection layer 1020, and may cover the upper surface 1011 and the lower surface 1012 of the substrate body 1010. For example, the protection layer 1030 may be formed on the substrate body 1010 and the metal interconnection layer 1020 to expose a portion of a central portion of each of the first electrode pads 1021 and a portion of a central portion of each of the second electrode pads 1022. However, in another embodiment, the protection layer 1030 may be formed on the substrate body 1010, exposing the entire upper surface of each of the first electrode pads 1021 and the second electrode pads 1022.

The semiconductor chip 1040 is formed in a central region of the upper surface 1011 of the substrate body 1010 using an adhesive layer 1041, and in this regard, the semiconductor chip 1040 may be mounted by wire bonding. However, in another embodiment, the semiconductor chip 1040 may be instead mounted by flip-chip bonding. The molding member 1050 may be formed on the entire upper surface 1011 of the substrate body 1010 so as to protect the semiconductor chip 1040, the adhesive layer 1041, and the bonding wire 1043.

The external contact electrodes 1060 may be respectively formed on the second electrode pads 1022 so as to stack the top semiconductor package 1000 on the bottom semiconductor package 700. In this regard, bonding of the second electrode pads 1022 and the bottom semiconductor package 700 via the external contact electrodes 1060 may be performed by a high-temperature heat treatment process such as a wave soldering process or a reflow soldering process. Hereinafter, the bonding by using a reflow soldering process will be described in detail. However, the inventive concept is not limited thereto. For example, the bonding may be instead performed using a wave soldering process.

In the present embodiment, the bottom semiconductor package 700 may be the first semiconductor package PKG1 of FIG. 1 and the top semiconductor package 1000 may be the second semiconductor package PKG2 of FIG. 1. Accordingly, in a temperature range in which the external contact electrodes 1060 are solidified, the bottom semiconductor package 700 has a positive warpage and the top semiconductor package 1000 has a negative warpage. Since a warpage direction of the top semiconductor package 1000 stacked on the bottom semiconductor package 700 is dependent on the warpage directions of the bottom semiconductor package 700 and the top semiconductor package 1000 in the temperature range in which the external contact electrodes 1060 are solidified, in the stacked semiconductor package 500, the top semiconductor package 1000 stacked on the bottom semiconductor package 700 is convex upward.

Figure 18:
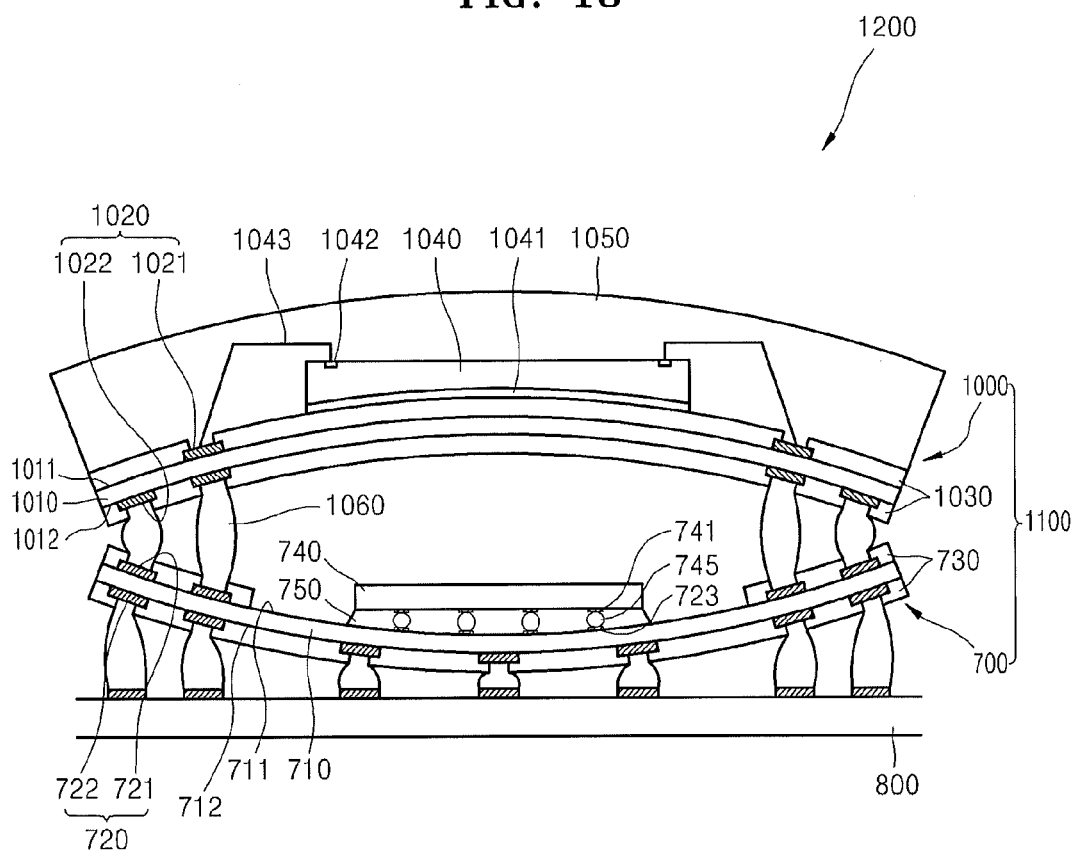
FIG. 18 is a cross-sectional view of a semiconductor device including a mother board and the stacked semiconductor package of FIG. 17 mounted on the mother board in some embodiments according to the inventive concept.

FIG. 18 is a cross-sectional view of a semiconductor device 1200 including the stacked semiconductor package 1100 of FIG. 17.

Referring to FIG. 18, the semiconductor device 1200 includes a mother board 800 and the stacked semiconductor package 1100 mounted on the mother board 800. In the present embodiment, the stacked semiconductor package 1100 corresponds to the stacked semiconductor package 1100 of FIG. 17.

In this regard, the stacked semiconductor package 1100 may be the third semiconductor package PKG3 of FIG. 1. Accordingly, at room temperature, the stacked semiconductor package 1100 is concave upward, and at high temperatures, the stacked semiconductor package 1100 is concave downward. In particular, in a reflow soldering process, in the temperature range in which the external contact electrodes 760 are solidified (about 200 degrees Centigrade to about 220 degrees Centigrade), the stacked semiconductor package 1100 still has a positive warpage and thus is concave downward. Since a warpage direction of the stacked semiconductor package 1100 mounted on the mother board 800 is dependent on the warpage direction of the stacked semiconductor package 1100 in the temperature range in which the external contact electrodes 760 are solidified, in the semiconductor device 1200, the semiconductor package 1100 mounted on the mother board 800 is convex downward.

In the present embodiment, sizes of the external contact terminals 810 formed on the mother board 800 may be determined corresponding to the pitches between the second electrode pads 722 of the semiconductor package 700 corresponding to the external contact terminals 810. For example, the pitches between the second electrode pads 722 formed in the central region F of the lower surface 712 of the semiconductor package 700 may be wider than the pitches between the second electrode pads 722 formed in the edge region G of the lower surface 712 of the semiconductor package 700. Accordingly, the pitches between the external contact terminals 810 corresponding to the second electrode pads 722 formed in the central region F of the lower surface 712 may be wider than the pitches between the external contact terminals 810 corresponding to the second electrode pads 722 formed in the edge region G of the lower surface 712.

For example, the mother board 800 may be a PCB substrate, the bottom semiconductor package 700 may be a CPU, and the top semiconductor package 1000 may be a memory. In this regard, a power voltage VDD or a ground voltage VSS may be applied to the second electrode pads 722 formed in the central region F of the second surface 712 of the bottom semiconductor package 700, and other signal voltages may be applied to the second electrode pads 722 formed in the edge region G.

Figure 19:
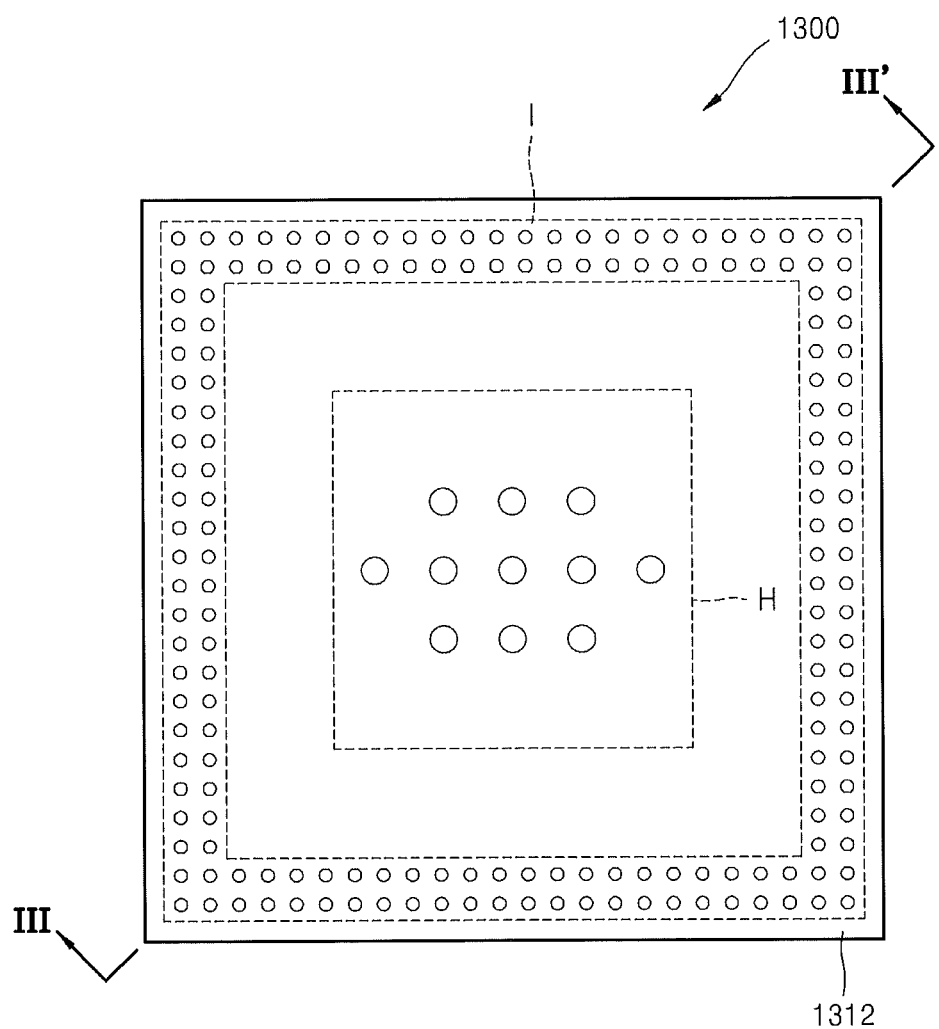
FIG. 19 is a bottom plan view of a semiconductor package according to another embodiment of the inventive concept.
Figure 20:
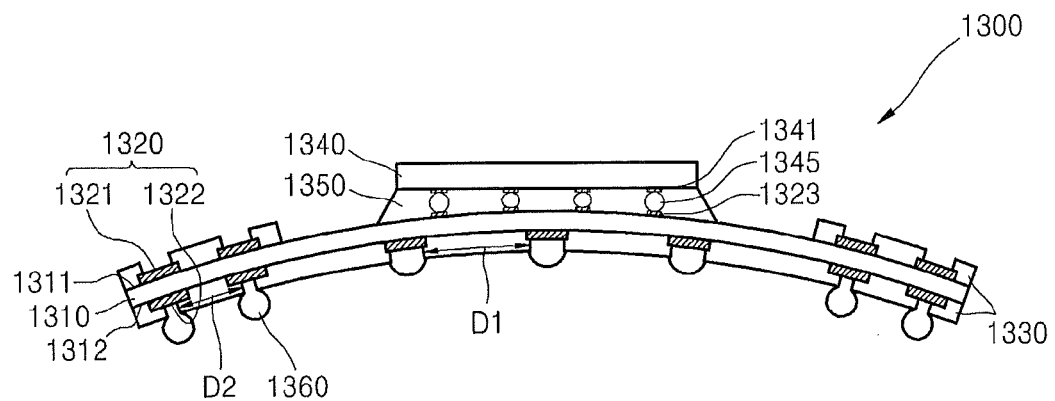
FIG. 20 is an example of a cross-sectional view taken along a line of FIG. 19 in some embodiments according to the inventive concept.

FIG. 19 is a bottom plan view of a semiconductor package 1300 according to another embodiment of the inventive concept. FIG. 20 is an example of a cross-sectional view taken along a line III-III' of FIG. 19.

Referring to FIGS. 19 and 20, the semiconductor package 1300 includes a substrate body 1310, a metal interconnection layer 1320, a protection layer 1330, a semiconductor chip 1340, a molding member 1350, and external contact electrodes 1360. The semiconductor package 1300 according to the present embodiment may be the first semiconductor package PKG1 described above. Thus, the semiconductor package 1300, at room temperature, may have a negative warpage, and thus, is convex upward as illustrated in FIG. 2. On the other hand, at high temperatures, that is, in the reflow soldering temperature range, the semiconductor package 1300 has a positive warpage, and thus, is convex downward as illustrated in FIG. 3. However, the inventive concept is not limited thereto, and, in another embodiment, the semiconductor package 1300 may have a positive warpage at room temperature and a negative warpage at high temperatures.

The substrate body 1310 is a square-shaped insulating plate having a given thickness and includes an upper surface 1311 and a lower surface 1312. In this regard, the substrate body 1310 may be embodied in substantially the same manner as described with the substrate body 110 of FIG. 6.

The metal interconnection layer 1320 includes first electrode pads 1321 formed on the upper surface 1311 of the substrate body 1310 and second electrode pads 1322 formed on the lower surface 1312 of the substrate body 1310. Although not illustrated, the first electrode pads 1321 may be electrically connected to the second electrode pads 1322 by vias passing through the substrate body 1310, and at least one inner interconnection layer may be further formed in the substrate body 1310. In this regard, the metal interconnection layer 1320 may be embodied in substantially the same manner as described with the metal interconnection layer 120 of FIG. 6.

The protection layer 1330 may be formed of an insulating material so as to protect the metal interconnection layer 1320, and may cover the upper surface 1311 and the lower surface 1312 of the substrate body 1310. In this regard, the protection layer 1330 may be embodied in substantially the same manner as described with the protection layer 130 of FIG. 6.

The semiconductor chip 1340 is mounted in a central region of the upper surface of 1311 of the substrate body 1310. The semiconductor chip 1340 may be embodied in the substantially similar manner as described with the semiconductor chip 140 of FIG. 6. In this regard, the semiconductor chip 1340 may be mounted using a flip-chip method. For example, contact pads 1341 formed on the semiconductor chip 1340 are disposed in a direction facing the substrate body 1310, and then, the contact pads 1341 formed on the semiconductor chip 1340 are electrically connected with bonding pads 1323 formed on the upper surface 1311 of the substrate body 1310 by solder balls 1345 that are conductive bumps.

The molding member 1350 is filled between the semiconductor chip 1340 and the upper surface of 1311 of the substrate body 1310 so as to protect an electrical connection between the semiconductor chip 1340 and the solder balls 1345. For example, the molding member 1350 may be embodied in substantially the same manner as described with the molding member 150 of FIG. 6.

The external contact electrodes 1360 are respectively formed on the second electrode pads 1322 so as to mount or stack the semiconductor package 1300 on either a mother board or another semiconductor package. In this regard, the external contact electrodes 1360 may be may be embodied in substantially the same manner as described with the external contact electrodes 160 of FIG. 6.

Referring to FIG. 19, the lower surface 1312 of the semiconductor package 1300 may be divided into a central region H on which the semiconductor chip 1340 is to be mounted and an edge region I outside the central region H. In this regard, pitches between the second electrode pads 1322 formed on the lower surface 1312 of the semiconductor package 1300 may vary according to location. For example, at least one selected from the group consisting of the pitches between the second electrode pads 1322 formed on the lower surface 1312 of the semiconductor package 1300 and exposure sizes of the second electrode pads 1322 may be different from each other according to location. Although, in the present embodiment, the lower surface 1312 of the semiconductor package 1300 is divided into the central region H and the edge region I, the inventive concept is not limited thereto. For example, in another embodiment, the semiconductor package 1300 may be instead divided into a central region, a middle region outside the central region, and an edge region outside the middle region.

If the semiconductor package 1300 has a positive warpage in the reflow soldering temperature range, it is possible that the external contact electrodes 1360 formed in the central region H of the semiconductor package 1300 are short-circuited in a reflow soldering process. However, in the present embodiment, pitches D1 between the second electrode pads 1322 formed in the central region H of the semiconductor package 1300 may be relatively wider than pitches D2 between the second electrode pads 1322 formed in the edge region I. Thus, even when the semiconductor package 1300 is concave downward in a reflow soldering process, short-circuiting of the external contact electrodes 1360 formed in the central region H may be prevented.

For example, in an embodiment, the pitches D1 between the second electrode pads 1322 formed in the central region H may be identical to each other, the pitches D2 between the second electrode pads 1322 formed in the edge region I may be identical to each other, and the pitches D1 between the second electrode pads 1322 formed in the central region H may be wider than the pitches D2 between the second electrode pads 1322 formed in the edge region I.

In another embodiment, the pitches D1 between the second electrode pads 1322 formed in the central region H may be different from each other, the pitches D2 between the second electrode pads 1322 formed in the edge region I may be identical to each other, and the pitches D1 between the second electrode pads 1322 formed in the central region H may be gradually narrowed in a direction away from the center of the semiconductor package 1300.

In another embodiment, the pitches D1 of the second electrode pads 1322 formed in the central region H may be different from each other, the pitches D2 of the second electrode pads 1322 formed in the edge region I may be different from each other, and the pitches between the second electrode pads 1322 in the central region H and the edge region I are gradually narrowed in a direction away from the center of the semiconductor package 1300.

Accordingly, even when the exposure sizes of the second electrode pads 1322 are identical to each other or volumes of the external contact electrodes 1360 are identical to each other, since the pitches D1 between the second electrode pads 1322 formed in the central region H are wider than the pitches D2 between the second electrode pads 1322 formed in the edge region I, short-circuiting of the external contact electrodes 1360 in the reflow soldering temperature range may be prevented.

In addition, if the semiconductor package 1300 has a positive warpage in the reflow soldering temperature range, heights of the external contact electrodes 1360 that are to be formed in the central region H of the semiconductor package 1300 may be relatively less than heights of the external contact electrodes 1360 that are to be formed in the edge region I of the semiconductor package 1300. To do this, the exposure sizes of the second electrode pads 1322 formed in the central region H of the semiconductor package 1300 may be set to be relatively greater than the exposure sizes of the second electrode pads 1322 formed in the edge region I. Furthermore, the volumes of the external contact electrodes 1360 formed in the central region H of the lower surface 1312 of the semiconductor package 1300 may be set to be relatively small, and the volumes of the external contact electrodes 1360 formed in the edge region I of the lower surface 1312 may be set to be relatively great. Accordingly, spread of the external contact electrodes 1360 in a lateral direction occurring when the external contact electrodes 1360 melts in the reflow soldering temperature range may be reduced, and thus, short-circuiting of adjacent external contact electrodes 1360 may be prevented.

As described above, according to the present embodiment, by differing pitches between the second electrode pads 1322 and at least one selected from the group consisting of the exposure sizes of the second electrode pads 1322 and the volumes of the external contact electrodes 1360, the heights of the external contact electrodes 1360 may be different from each other, and thus, coplanarity of the external contact electrodes 1360 of the semiconductor package 1300 may be improved and short-circuiting of the external contact electrodes 1360 may be prevented.

Meanwhile, if the semiconductor package 1300 has a negative warpage in the reflow soldering temperature range, pitches between the second electrode pads 1322 formed in the edge region I of the semiconductor package 1300 may be wider than pitches between the second electrode pads 1322 formed in the central region H. In addition, the exposure sizes of the second electrode pads 1322 formed in the central region H of the semiconductor package 1300 may be smaller than the exposure sizes of the second electrode pads 1322 formed in the edge region I. Furthermore, the volumes of the external contact electrodes 1360 formed in the central region H of the semiconductor package 1300 may be greater than the volumes of the external contact electrodes 1360 formed in the edge region I.

Figure 21:
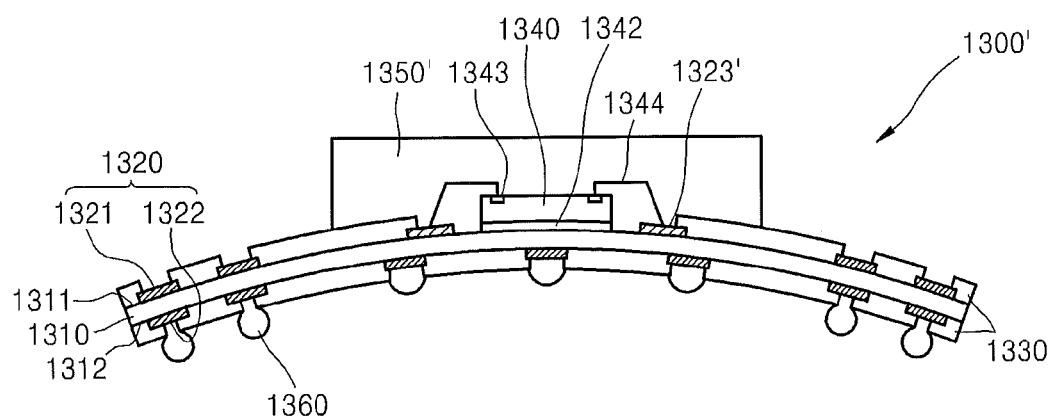
FIG. 21 is another example of a cross-sectional view taken along the line of FIG. 19.

FIG. 21 is another example of a cross-sectional view taken along the line of FIG. 19.

Referring to FIG. 21, a semiconductor package 1300' includes the substrate body 1310, the metal interconnection layer 1320, the protection layer 1330, the semiconductor chip 1340, a molding member 1350', and the external contact electrodes 1360. The semiconductor package 1300' according to the present embodiment is fabricated by modifying an element of the semiconductor package 1300 of FIG. 20. Accordingly, hereinafter, differences between the semiconductor package 1300' and the semiconductor package 1300 of FIG. 20 will be described.

The semiconductor chip 1340 is formed in the central region of the upper surface of 1311 of the substrate body 1310 using an adhesive layer 1342, and in this regard, the semiconductor chip 1340 is mounted by wire bonding. For example, the semiconductor chip 1340 is placed in such a way that a portion of the semiconductor chip 1340 including contact pads 1343 faces upward, and then the contact pads 1343 of the semiconductor chip 1340 are electrically connected to bonding pads 1323' formed on the substrate body 1310 by using bonding wires 1344.

The molding member 1350' may be formed on the substrate body 1310 so as to protect the semiconductor chip 1340, the adhesive layer 1342, and the bonding wires 1344. For example, the molding member 1350' may be embodied in substantially the same manner as described with the molding member 150' of FIG. 7.

Figure 22:
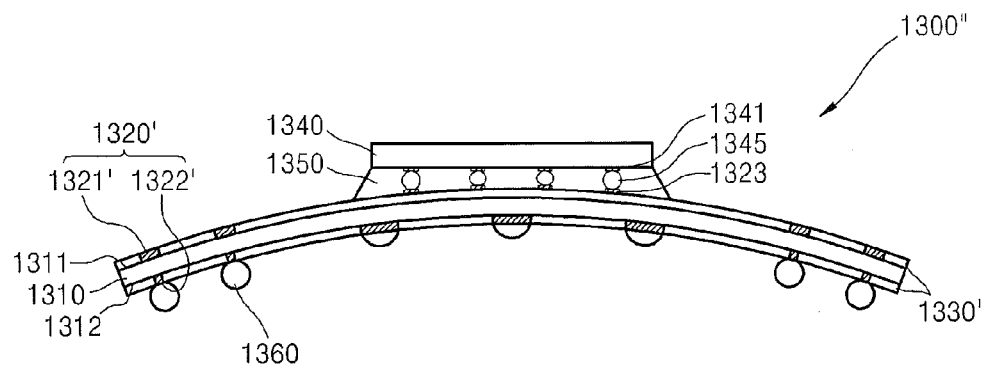
FIG. 22 is another example of a cross-sectional view taken along the line of FIG. 19 in some embodiments according to the inventive concept.

FIG. 22 is another example of a cross-sectional view taken along the line of FIG. 19.

Referring to FIG. 22, a semiconductor package 1300" may include the substrate body 1310, a metal interconnection layer 1320', a protection layer 1330', the semiconductor chip 1340, the molding member 1350, and the external contact electrodes 1360. The semiconductor package 1300" according to the present embodiment is fabricated by modifying an element of the semiconductor package 1300 of FIG. 20. Accordingly, hereinafter, differences between the semiconductor package 1300" and the semiconductor package 1300 of FIG. 20 will be described.

The metal interconnection layer 1320' includes first electrode pads 1321' formed on the upper surface of 1311 of the substrate body 1310 and second electrode pads 1322' formed on the lower surface 1312 of the substrate body 1310. In this regard, the metal interconnection layer 1320' may be embodied in substantially the same manner as described with the metal interconnection layer 120' of FIG. 8.

The protection layer 1330' may be formed of an insulating material so as to protect the metal interconnection layer 1320', and may cover the upper surface 1311 and the lower surface 1312 of the substrate body 1310. In this regard, protection layer 1330' may be embodied in the substantially similar manner as described with the protection layer 130' of FIG. 8.

Figure 23:
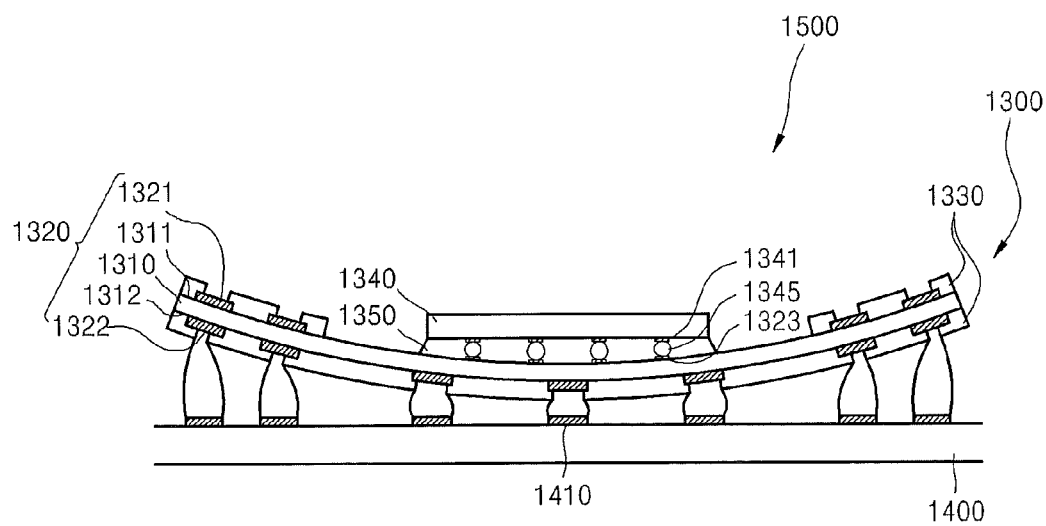
FIG. 23 is a cross-sectional view of a semiconductor device including a mother board and the semiconductor package of FIG. 20 mounted on the mother board in some embodiments according to the inventive concept.

FIG. 23 is a cross-sectional view of a semiconductor device 1500 including a mother board 1400 and the semiconductor package 1300 of FIG. 20 mounted on the mother board 1400.

Referring to FIG. 23, the semiconductor device 1500 includes the mother board 1400 and the semiconductor package 1300 mounted on the mother board 1400. In the present embodiment, the semiconductor package 1300 is the semiconductor package 1300 of FIG. 20.

As described above, the semiconductor package 1300 of FIG. 20 may be the first semiconductor package PKG1 of FIG. 1. Thus, the semiconductor package 1300 may be convex upward at room temperature, and the semiconductor package 1300 may be convex downward at high temperatures. In particular, in a reflow soldering process, in a temperature range in which the external contact electrodes 1360 are solidified (about 200 degrees Centigrade to about 220 degrees Centigrade), the semiconductor package 1300 still has a positive warpage, and thus, the semiconductor package 1300 is convex downward. Since a warpage direction of the semiconductor package 1300 mounted on the mother board 1400 is dependent on the warpage direction of the semiconductor package 1300 in the temperature range in which the external contact electrodes 1360 are solidified, in the semiconductor device 1500, the semiconductor package 1300 mounted on the mother board 1400 is convex downward.

In the present embodiment, pitches between external contact terminals 1410 formed on the mother board 1400 may be may be determined corresponding to the pitches between the second electrode pads 1322 of the semiconductor package 1300 corresponding to the external contact terminals 1410. For example, the pitches between the second electrode pads 1322 formed in the central region H of the lower surface 1312 of the semiconductor package 1300 may be wider than the pitches between the second electrode pads 1322 formed in the edge region I of the lower surface 1312 of the semiconductor package 1300. Accordingly, the pitches between the external contact terminals 1410 corresponding to the second electrode pads 1322 formed in the central region H of the lower surface 1312 may be wider than the pitches between the external contact terminals 1410 corresponding to the second electrode pads 1322 formed in the edge region I of the lower surface 1312.

In addition, in the present embodiment, the sizes of the second electrode pads 1322 formed in the central region H of the lower surface 1312 of the semiconductor package 1300 may be greater than the sizes of the second electrode pads 1322 formed in the edge region I of the lower surface 1312 of the semiconductor package 1300.

Figure 24:
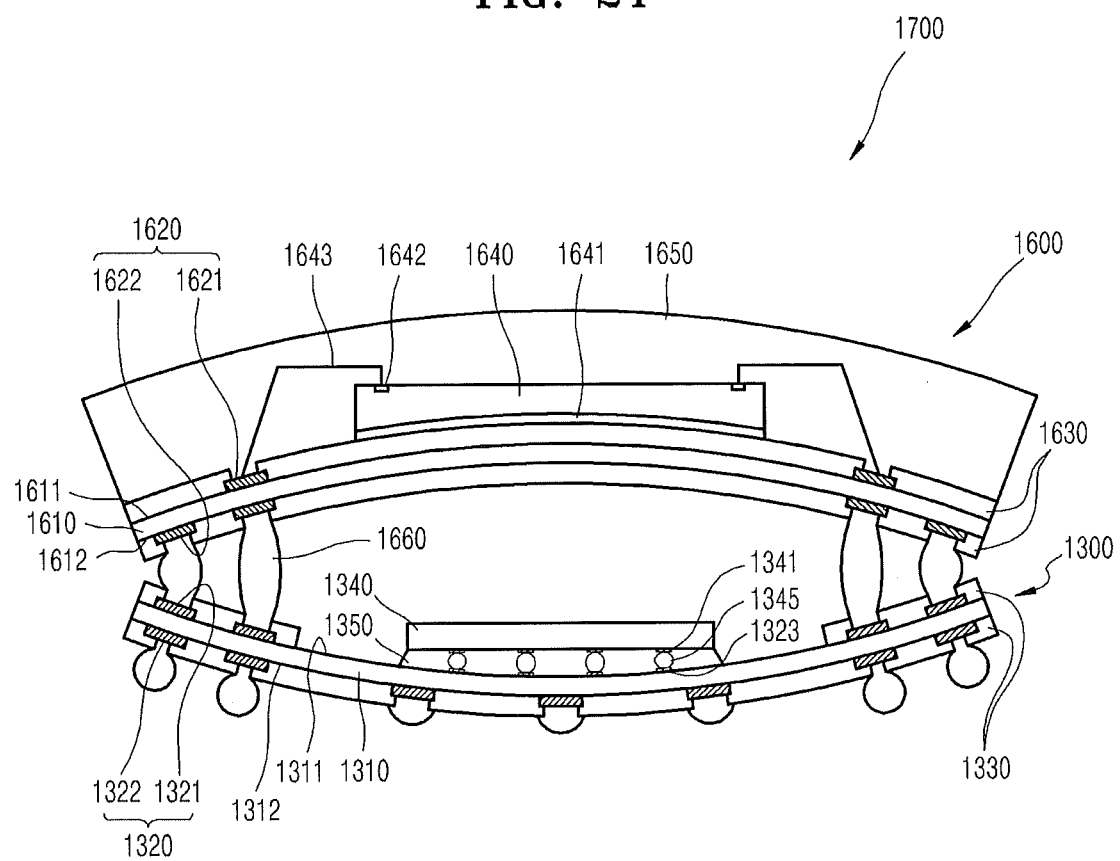
FIG. 24 is a cross-sectional view of a stacked semiconductor package including the semiconductor package of FIG. 20 in some embodiments according to the inventive concept.

FIG. 24 is a cross-sectional view of a stacked semiconductor package 1700 including the semiconductor package 1300 of FIG. 20.

Referring to FIG. 24, the stacked semiconductor package 1700 includes a bottom semiconductor package 1300 and a top semiconductor package 1600 stacked on the bottom semiconductor package 1300. In the present embodiment, the bottom semiconductor package 1300 is the semiconductor package 1300 of FIG. 20. In addition, the top semiconductor package 1600 may be embodied in substantially the same manner as described with the top semiconductor package 1100 of FIG. 17.

Figure 25:
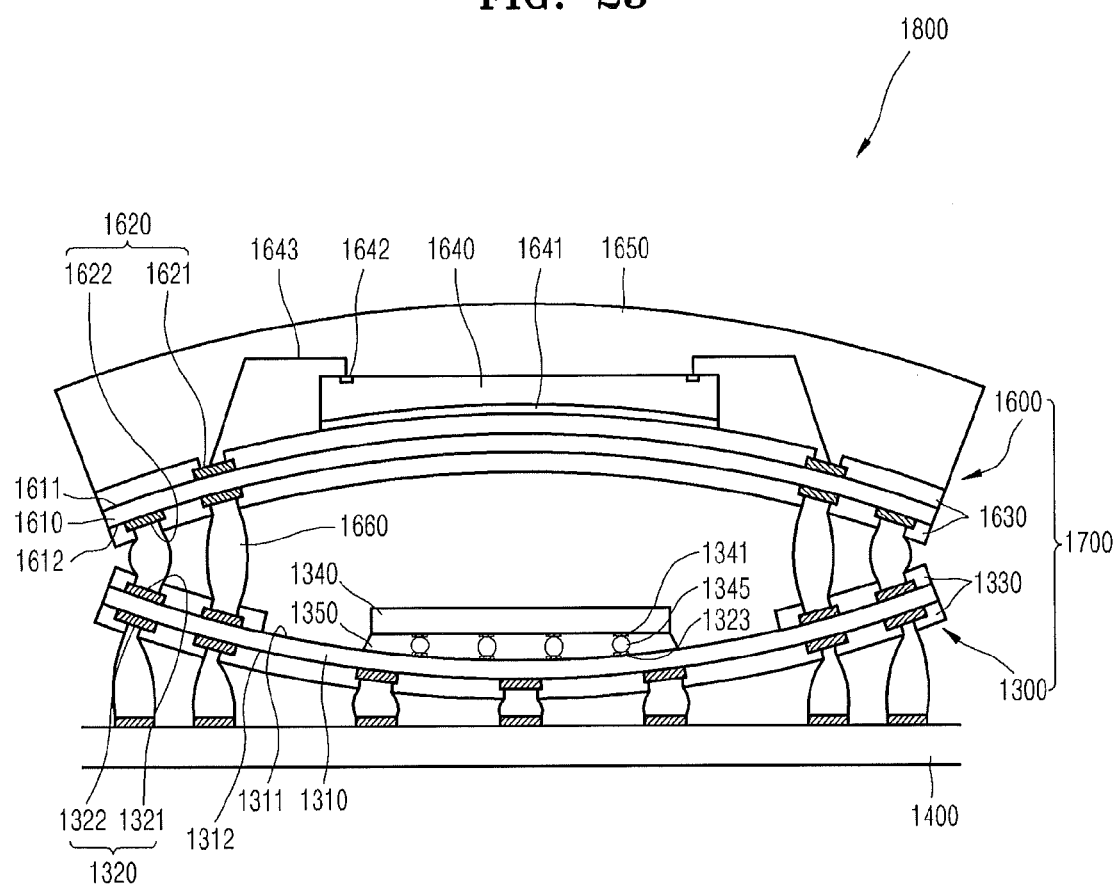
FIG. 25 is a cross-sectional view of a semiconductor device including a mother board and the stacked semiconductor package of FIG. 24 mounted on the mother board in some embodiments according to the inventive concept.

FIG. 25 is a cross-sectional view of a semiconductor device 1800 including the stacked semiconductor package 1700 of FIG. 24.

Referring to FIG. 25, the semiconductor device 1800 includes a mother board 1400 and the stacked semiconductor package 1700 mounted on the mother board 1400. In the present embodiment, the stacked semiconductor package 1700 is the stacked semiconductor package 1700 of FIG. 24.

For example, the mother board 1400 may be a PCB substrate, the bottom semiconductor package 1300 may be a CPU, and the top semiconductor package 1600 may be a memory. In this regard, a power voltage VDD or a ground voltage VSS may be applied to the second electrode pads 1322 formed in the central region H of the second surface 1312 of the bottom semiconductor package 1300, and other signal voltages may be applied to the second electrode pads 1322 formed in the edge region G.

Figure 26:
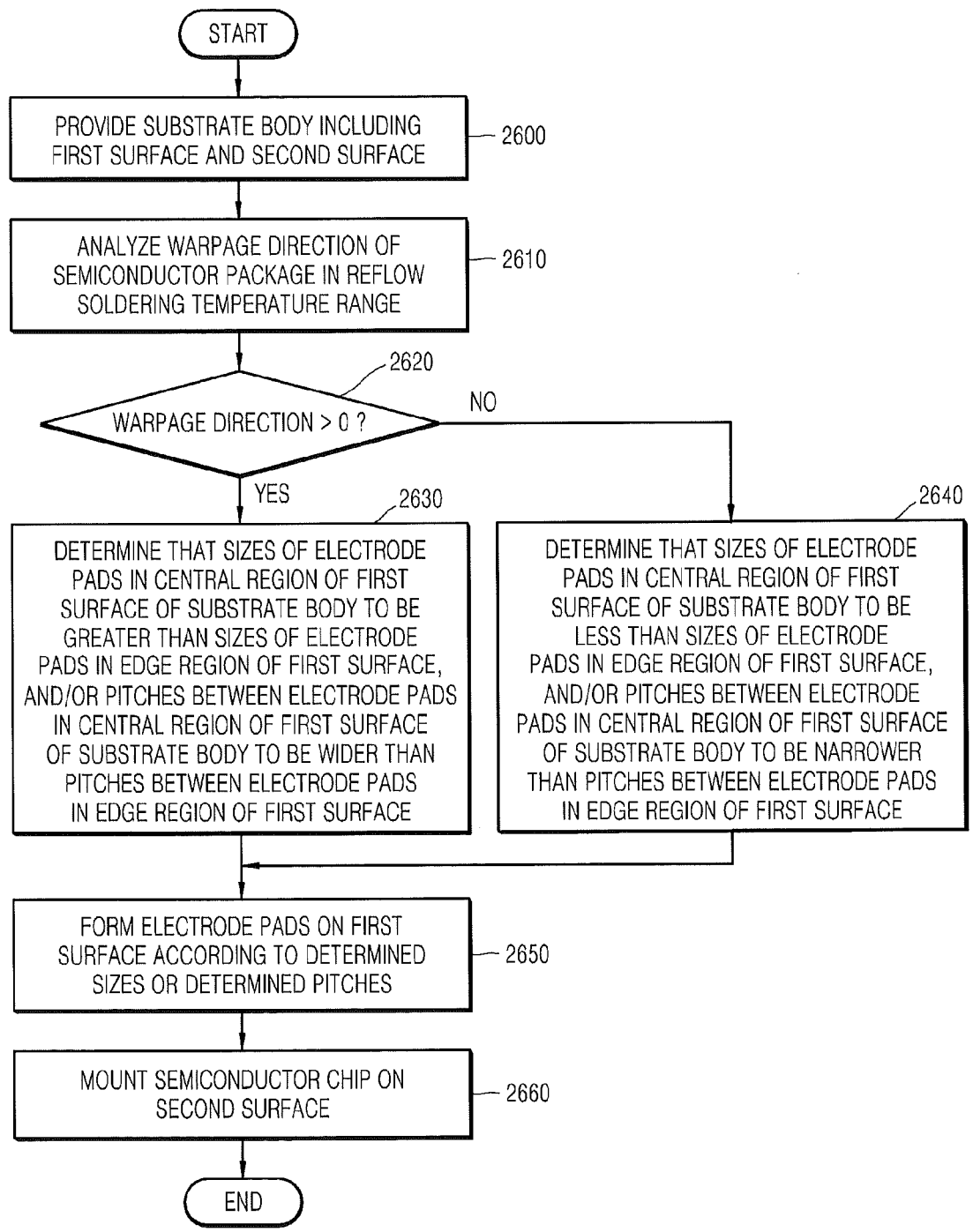
FIG. 26 is a flowchart illustrating a method of fabricating a semiconductor package, according to an embodiment of the inventive concept.

FIG. 26 is a flowchart illustrating a method of fabricating a semiconductor package, according to an embodiment of the inventive concept.

Referring to FIG. 26, the method according to the present embodiment is used to fabricate the semiconductor packages illustrated in FIGS. 5 to 25. Accordingly, the descriptions presented with reference to FIGS. 5 to 25 are also applied to the present embodiment.

In operation 2600, a substrate body including a first surface and a second surface is provided.

In operation 2610, by referring to a reflow soldering profile of a semiconductor package, a warpage direction of the semiconductor package in a reflow soldering temperature range is analyzed.

In operation 2620, it is determined whether, in the reflow soldering temperature range, a warpage direction value of the semiconductor package is greater than 0. If the warpage direction value of the semiconductor package is greater than 0 (i.e., positive), the semiconductor package is concave downward, and in this case, operation 2630 is performed. On the other hand, if the warpage direction value of the semiconductor package is less than 0 (i.e., negative), the semiconductor package is concave upward, and in this case, operation 2640 is performed.

In operation 2630, sizes of electrode pads that are to be disposed in a central region of the first surface of the substrate body are determined to be greater than sizes of electrode pads that are to be disposed in an edge region of the first surface and/or pitches between electrode pads that are to be disposed in the central region of the first surface of the substrate body are determined to be wider than pitches between electrode pads that are to be disposed in the edge region of the first surface.

In operation 2640, the sizes of the electrode pads that are to be disposed in the central region of the first surface of the substrate body are determined to be smaller than the sizes of the electrode pads that are to be disposed in the edge region of the first surface and/or the pitches between the electrode pads that are to be disposed in the central region of the first surface of the substrate body are determined to be narrower than the pitches between the electrode pads that are to be disposed in the edge region of the first surface.

In operation 2650, according to at least one of the sizes and pitches determined in operation 2630 or operation 2640, the electrode pads are formed on the first surface of the substrate body.

In operation 2660, a semiconductor chip is mounted on the second surface of the substrate body.

Hereinafter, various application examples using a semiconductor package according to an embodiment of the inventive concept will be described herein. Herein, only some of the application examples will be presented.

Figure 27:
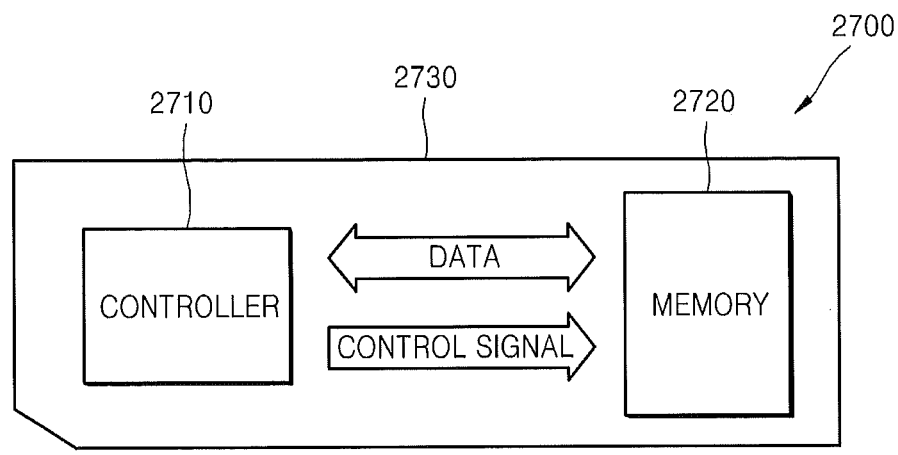
FIG. 27 is a schematic view of a memory card using a semiconductor package according to an embodiment of the inventive concept.

FIG. 27 is a schematic view of a memory card 2700 using a semiconductor package according to an embodiment of the inventive concept.

Referring to FIG. 27, the memory card 2700 may include a controller 2710, a memory 2720, and a housing 2730 including the controller 2710 and the memory 2720, and the controller 2710 and the memory 2720 may exchange electrical signals with each other. For example, according to a command of the controller 2710, the memory 2720 and the controller 2710 may exchange data with each other. As such, the memory card 2700 may store data in the memory 2720 or may output data from the memory 2720 to the outside.

For example, the memory 2720 may include the semiconductor packages, the semiconductor devices, or the stacked semiconductor package, illustrated in FIGS. 5 to 25. The memory card 2700 may be used as a data storage medium of various portable devices. For example, the memory card 2700 may include a multi media card (MMC) or a secure digital (SD) card.

Figure 28:
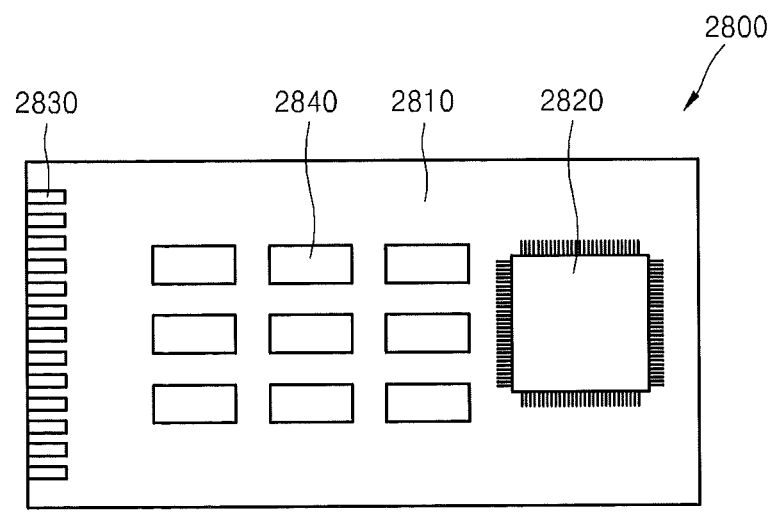
FIG. 28 is a schematic view of a package module using a semiconductor package according to an embodiment of the inventive concept.

FIG. 28 is a schematic view of a package module 2800 using a semiconductor package according to an embodiment of the inventive concept.

Referring to FIG. 28, a semiconductor package according to an embodiment of the inventive concept may be used in the package module 2800. The package module 2800 includes a module substrate 2810 and a plurality of semiconductor packages 2840 attached to the module substrate 2810. A quad flat package QFP-type package 2820 is attached to one side of the package module 2800 and an external contact terminal 2830 is located on another side of the package module 2800. A semiconductor package according to an embodiment of the inventive concept may be used in, in addition to the package module 2800 of FIG. 28, any one of various other package modules.

Figure 29:
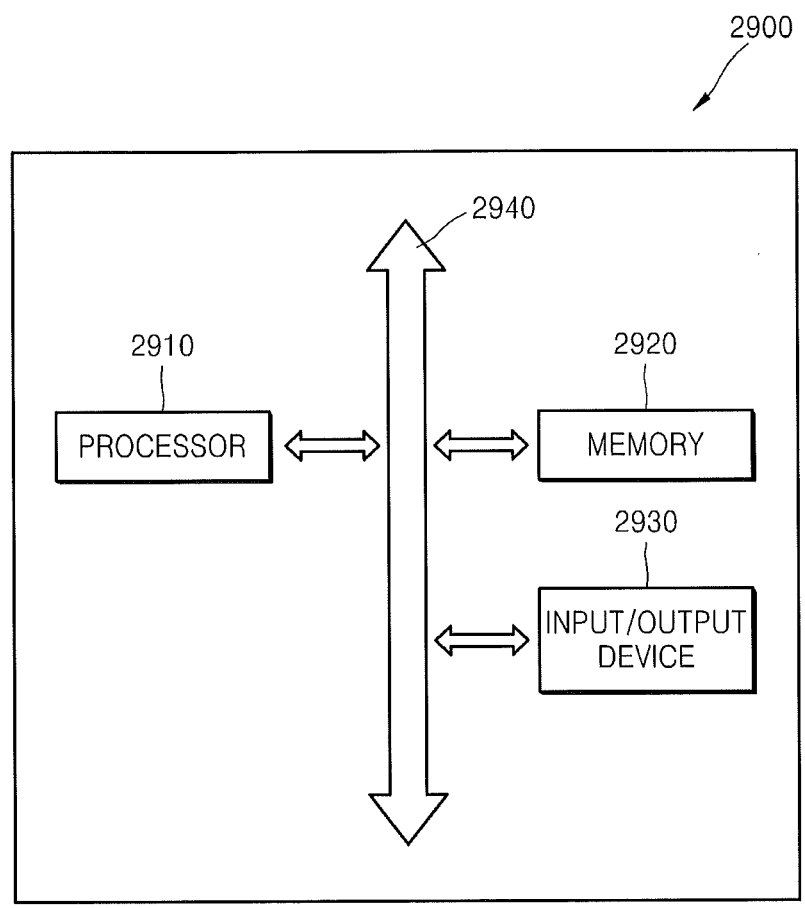
FIG. 29 is a schematic view of an electronic system using a semiconductor package according to an embodiment of the inventive concept.

FIG. 29 is a schematic view of an electronic system 2900 using a semiconductor package according to an embodiment of the inventive concept.

Referring to FIG. 29, the electronic system 2900 may include a processor 2910, a memory unit 2920, and an input/output device 2930, and the processor 2910, the memory unit 2920, and the input/output device 2930 data-communicate with each other through a bus 2940. The processor 2910 executes a program and controls the electronic system 2900. The input/output device 2930 may input or output data of the electronic system 2900. The electronic system 2900 may be connected to an external device such as a personal computer or a network through the input/output device 2930 and may data-communicate with the external device. The memory portion 2920 may store code and data for operating the processor 2910. For example, the memory portion 2910 may include the semiconductor packages, the semiconductor devices, or the stacked semiconductor package, illustrated in FIGS. 5 to 25.

For example, the electronic system 2900 may constitute various electronic control devices requiring the memory 2920, and may be used in, for example, a mobile phone, a MP3 player, a navigation device, a solid state drive (SSD), or household appliances.

While the inventive concept has been particularly shown and described with reference to exemplary embodiments thereof, it will be understood that various changes in form and details may be made therein without departing from the spirit and scope of the following claims.

What is claimed:

1. A semiconductor device comprising:
   a semiconductor package comprising a substrate body comprising a first surface and a second surface, a semiconductor chip mounted on the first surface, and a plurality of first electrode pads formed on the second surface;
   a plurality of external contact electrodes respectively formed on the first electrode pads; and
   a mother board comprising a plurality of second electrode pads respectively electrically connected to the external contact electrodes,
   wherein at least one selected from the group consisting of heights of the external contact electrodes and pitches between the first electrode pads are determined to be different from each other according to a warpage direction of the semiconductor package in a soldering temperature range near a melting point of the external contact electrodes in a heat treatment process for forming the external contact electrodes.

2. The semiconductor device of claim 1, wherein at least one selected from the group consisting of sizes of the first electrode pads and volumes of the external contact electrodes are determined to be different from each other according to the warpage direction of the semiconductor package in the soldering temperature range, and correspondingly, the heights of the external contact electrodes are determined to be different from each other.

3. The semiconductor device of claim 1, wherein sizes of the second electrode pads are determined to be different from each other, corresponding to at least one selected from the group consisting of volumes of the external contact electrodes corresponding to the second electrode pads and sizes of the first electrode pads corresponding to the second electrode pads.

4. The semiconductor device of claim 1, wherein pitches between the second electrode pads are determined to be different from each other, corresponding to pitches of the first electrode pads corresponding to the second electrode pads.

5. The semiconductor device of claim 1, wherein the semiconductor package has a positive, that is, concave warpage in the soldering temperature range.

6. The semiconductor device of claim 5, wherein pitches between the first electrode pads are narrowed in a direction away from the center of the second surface.

7. The semiconductor device of claim 5, wherein pitches of the first electrode pads formed in a central region of the second surface are wider than pitches of the first electrode pads formed in an edge region of the second surface.

8. The semiconductor device of claim 7, wherein the pitches of the first electrode pads formed in the central region of the second surface are identical to each other, and the pitches of the first electrode pads formed in the edge region of the second surface are identical to each other.

9. The semiconductor device of claim 5, wherein pitches of the first electrode pads formed in a central region of the second surface are narrowed in a direction away from the center of the second surface, and pitches of the first electrode pads formed in an edge region of the second surface are identical to each other.

10. The semiconductor device of claim 5, wherein heights of the external contact electrodes formed in a central region of the second surface are smaller than heights of the external contact electrodes formed in an edge region of the second surface.

11. The semiconductor device of claim 10, wherein sizes of the first electrode pads formed in the central region of the second surface are greater than sizes of the first electrode pads formed in the edge region of the second surface.

12. The semiconductor device of claim 10, wherein at least one of the first electrode pads formed in the central region of the second surface is a dummy pad.

13. The semiconductor device of claim 10, wherein volumes of the external contact electrodes formed in the central region of the second surface are smaller than volumes of the external contact electrodes formed in the edge region of the second surface.

14. The semiconductor device of claim 1, further comprising a top semiconductor package stacked on the semiconductor package.

15. A semiconductor package comprising:
    a substrate body having a first surface and a second surface;
    a semiconductor chip mounted on the first surface, and
    a plurality of electrode pads on the second surface selectively formed to have progressively smaller sizes from a central region of the substrate body toward an outer edge of the substrate body based on a first reflow soldering process warpage profile for the semiconductor package and formed to have progressively larger sizes extending from the central region of the substrate body toward the outer edge of the substrate body based on a second reflow soldering process warpage profile for the semiconductor package.

16. The semiconductor package of claim 15, further comprising:
    a motherboard having the substrate body mounted thereon, including external contact electrodes electrically coupled to respective ones of the pluralities of electrode pads, wherein external contact electrodes have sizes that progressively increase or decrease from the central portion towards the outer edge.

17. The semiconductor package of claim 16, wherein the semiconductor package has a first warpage at a reflow temperature and the motherboard has a second warpage that is opposite the first warpage at the reflow temperature.

* * * * *